US 6,331,796 B1

(12) United States Patent
Hamada et al.

(10) Patent No.: US 6,331,796 B1
(45) Date of Patent: Dec. 18, 2001

(54) SEMICONDUCTOR INTEGRATED CIRCUIT DEVICE HAVING TRANSISTOR LOGIC AND LOAD CIRCUITS

(75) Inventors: Mototsugu Hamada, Kohoku-Ku; Tadahiro Kuroda, Sumida-Ku, both of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/711,329

(22) Filed: Nov. 13, 2000

Related U.S. Application Data

(63) Continuation of application No. 09/226,954, filed on Jan. 8, 1999, now abandoned.

(30) Foreign Application Priority Data

Jan. 29, 1998 (JP) .................................................. 10-017228

(51) Int. Cl.[7] .................................................. H03K 3/356
(52) U.S. Cl. .......................... 327/208; 327/210; 327/218
(58) Field of Search .................................. 327/202, 203, 327/407–409, 208, 544, 218, 200, 199, 201, 209–212

(56) References Cited

U.S. PATENT DOCUMENTS

| 5,264,738 | * | 11/1993 | Veendrick et al. | .................. | 327/203 |
| 5,293,060 | * | 3/1994 | Komori et al. | ....................... | 257/544 |
| 5,541,885 | * | 7/1996 | Takashima | ............................ | 365/226 |
| 5,796,313 | * | 8/1998 | Eitan | ....................... | 331/57 |
| 5,982,211 | * | 11/1999 | Ko | ....................... | 327/202 |
| 6,054,730 | * | 4/2000 | Noguchi | .............................. | 257/306 |

FOREIGN PATENT DOCUMENTS

| 000339737 | * | 11/1989 | (EP) | ..................................... | 327/210 |
| 02283123 | * | 4/1989 | (JP) | ..................................... | 327/203 |

OTHER PUBLICATIONS

Yano, et al., "Top–Down Pass–Transistor Logic Design," IEEE Journal of Solid–State Circuits, vol. 31, No. 6, Jun. 1996, pp. 792–803.

* cited by examiner

Primary Examiner—Tuan T. Lam
(74) Attorney, Agent, or Firm—Hogan & Hartson, L.L.P.

(57) ABSTRACT

A p-type MOS transistor 40 in a CMOS inverter 50 of a load circuit 20 has a threshold voltage whose absolute value |Vtp| is higher than the threshold voltage Vtn of an n-type MOS transistor 30 forming a pass-transistor logic circuit 10. Therefore, even when the output signal V1out from the pass-transistor logic circuit 10 is HIGH, a leak current can be prevented from flowing into the CMOS inverter.

19 Claims, 12 Drawing Sheets

US 6,331,796 B1

SEMICONDUCTOR INTEGRATED CIRCUIT DEVICE HAVING TRANSISTOR LOGIC AND LOAD CIRCUITS

This application is a continuation application of U.S. patent application Ser. No. 09/226,954 filed Jan. 8, 1999, now abandoned.

FIELD OF THE INVENTION

This invention relates to a semiconductor integrated circuit device and, more particularly, one having a pass-transistor logic circuit and a load circuit.

DESCRIPTION OF THE PRIOR ART

Pass-transistor logic circuit technique is one of technologies for saving consumption power of LSIs or other semiconductor integrated circuit devices. In "Top-Down Pass-Transistor Logic Design" in IEEE, J. Solid State Circuits, vol. 31, pp. 792–803, 1996, an arrangement of a single-rail logic pass-transistor is proposed. FIG. 11 shows the circuit arrangement in the literature.

As shown in FIG. 11, a semiconductor integrated circuit device includes a pass-transistor logic circuit 1 and a load circuit 2. The pass-transistor logic circuit 1 is made up of n-type MOS transistors alone. In FIG. 11, only the final stage n-type MOS transistor 3 connected to the load circuit 2 is shown. The pass-transistor logic circuit 1 is configured to conduct various logic operations by combining these n-type MOS transistors.

The load circuit 2 includes a CMOS inverter 4 and a feedback mechanism. The feedback mechanism includes a p-type MOS transistor 5. The CMOS inverter 4 has a p-type MOS transistor 6 and an n-type MOS transistor 7. The load circuit 2 is connected to another circuit not shown.

Still referring to FIG. 11, an output signal V1out of the pass-transistor logic circuit 1 enters into the CMOS inverter 4 of the load circuit 2. The inverter 4 issues an output signal V2out. The output signal V2out is supplied to another circuit not shown and also to the gate terminal of the p-type MOS transistor 5.

Since the pass-transistor logic circuit 1 consists only of n-type MOS transistor, when the output signal V1out of the pass-transistor logic circuit 1 is HIGH, a voltage lower than the source voltage VDD by the threshold voltage Vtn of the n-type MOS transistor 3 is output. That is, when the output signal V1out of the n-type MOS transistor 3 is HIGH, VDD−Vtn is output. VDD−Vtn is not always sufficiently high. If such an insufficiently high signal is introduced into the CMOS inverter 4 operative with the source voltage VDD, both the p-type MOS transistor 6 and the n-type MOS transistor 7 are turned ON, and cause a leak current to flow continuously. That is, there occurs the problem that a leak current continues to flow from the source voltage VDD of the CMOS inverter 4 to the ground GND via the p-type MOS transistor 6 and the n-type MOS transistor 7. Continuous flow of the leak current results in increasing the consumption power.

To prevent the leak current, the semiconductor integrated circuit device of FIG. 11 uses a feedback mechanism having the p-type MOS transistor. More specifically, the output signal V2out of the CMOS inverter 4 is input to the gate terminal of the p-type MOS transistor 5. When the input to the CMOS inverter 4 is HIGH, the output signal V2out is LOW. As a result, the p-type MOS transistor 5 turns ON, and the source voltage VDD of the p-type MOS transistor 5 is supplied to the input of the CMOS inverter 4. In this manner, it is ensured that a HIGH signal of a sufficient voltage be supplied to the input of the CMOS inverter 4 by inverting and feeding the output of the CMOS inverter 4 back to the input thereof. Since a sufficiently high signal is supplied to the p-type MOS transistor 6 of the CMOS inverter 4, the p-type MOS transistor 6 gets into a sufficient off state, and the leak current stops.

The problem of insufficiently high signals cannot occur when the output signal of the pass-transistor logic circuit 1 V1out is LOW because, when the input to the n-type MOS transistor 3 is 0 V, the n-type MOS transistor 3 outputs 0 V. That is, output signal V1out of the pass-transistor logic circuit 1 becomes a sufficiently low signal. Due to the sufficiently low signal output from the pass-transistor logic circuit 1, the n-type MOS transistor 7 of the CMOS inverter 4 gets in a sufficiently off state, and the p-type MOS transistor 6 turns on. As a result, although the CMOS inverter 4 outputs a HIGH signal as the output signal V2out, no leak current flows.

Therefore, by connecting the output of the CMOS inverter 4 to the gate terminal of the p-type MOS transistor 5 for the feedback purpose, the input to the CMOS inverter 4 is ensured to be sufficiently low or sufficiently high, and a continuous leak current can be prevented.

FIG. 12 shows another conventional semiconductor integrated circuit device. In the semiconductor integrated circuit device shown here, a load circuit 2' includes two inverters 4 for the purpose of achieving high-speed operation. More specifically, by independently providing the inverter 4 forming the feedback mechanism and the inverter 4 for supplying the output signal V2out to another circuit, the load to the CMOS inverter 4 serving to supply the signal to another circuit is decreased to ensure high-speed operation. Also the semiconductor integrated circuit device shown in FIG. 12 operates similarly. Therefore, the input to the CMOS inverter 4 is ensured to be sufficiently low or sufficiently high, and the continuous leak current can be prevented.

These arrangements, however, still involve problems explained below. Referring to FIG. 11, for example, when the output signal V1out from the pass-transistor logic circuit 1 changes from HIGH to LOW, there occurs a state where the input voltage to the n-type MOS transistor 3 is LOW and the p-type MOS transistor 5 for the feedback purpose is ON. In this state, a short-circuit current flows from the source voltage VDD of the p-type MOS transistor 5 to the input voltage-to the source terminal of the n-type MOS transistor 3. That is, since the source voltage VDD of the source terminal S of the p-type MOS transistor 5 and the ground of the source terminal S is short-circuited, a large current flows.

For recovery from this state, it is necessary that the force for changing the input to the CMOS inverter 4 in the pass-transistor logic circuit 1 to LOW is greater than the force for maintaining the high state in the p-type MOS transistor 5. That is, the n-type MOS transistor 3 must be stronger than the p-type MOS transistor 5. Therefore, a ratio design is required for the circuit arrangement. The circuit of a ratio design, however, operates differently depending upon sizes of MOS transistors. Additionally, circuits of a ratio design require a circuit design allowing for variances in the process for fabricating MOS transistors, namely, a large design margin.

SUMMARY OF THE INVENTION

It is therefore an object of the invention to provide a semiconductor circuit device capable of preventing a leak current of a CMOS inverter in a load circuit without using a feedback mechanism. That is, it is the object of the invention to provide a semiconductor circuit device including a pass-transistor logic circuit and a load circuit which do not require a ratio design.

According to the invention, there is provided a semiconductor integrated circuit device comprising:

a pass-transistor logic circuit having at least one n-type MOS transistor for a logic circuit to supply a logic output signal; and a load circuit having a CMOS inverter including a p-type MOS transistor forming the CMOS inverter and an n-type MOS transistor forming the CMOS inverter which are connected in series between a first power source and a second power source, the p-type MOS transistor forming the CMOS inverter and the n-type MOS transistor forming the CMOS inverter having gate terminals supplied with the logic output signal forming the input of said CMOS inverter, the p-type MOS transistor forming the CMOS inverter and the n-type MOS transistor forming the CMOS inverter having a common connected point from which a load output signal is output and which forms the output of the CMOS inverter, and said p-type MOS transistor forming the CMOS inverter having a threshold voltage value whose absolute value |Vtp| is larger than the threshold voltage Vtn of the n-type MOS transistor forming the logic circuit.

According to the invention, there is further provided a semiconductor integrated circuit device comprising:

a pass-transistor logic circuit having at least one n-type MOS transistor for a logic circuit to supply a logic output signal; and a load circuit including a CMOS inverter having a p-type MOS transistor forming the CMOS inverter and an n-type MOS transistor forming the CMOS inverter which are connected in series between a first power source and a second power source, the p-type MOS transistor forming the CMOS inverter and said n-type MOS transistor forming the CMOS inverter having gate terminals supplied with the logic output signal forming the input of the CMOS inverter, the p-type MOS transistor forming the CMOS inverter and the n-type MOS transistor forming the CMOS inverter having a common connected point from which a load output signal is output and which forms the output of the CMOS inverter, and the p-type MOS transistor forming the CMOS inverter having a threshold voltage value whose absolute value |Vtp| is larger than the threshold voltage Vtn of the n-type MOS transistor forming the logic circuit, the load circuit further including a feedback mechanism which does not function when the pass-transistor logic circuit is in the operative mode, but functions when the pass-transistor logic circuit is in the non-operative mode to supply the first power source to the input of the CMOS inverter.

According to the invention, there is further provided a semiconductor integrated circuit device comprising:

a pass-transistor logic circuit including at least one n-type MOS transistor forming the logic circuit to supply a logic output signal, the n-type MOS transistor forming the logic circuit being selectively applied with a substrate potential control signal to raise the threshold voltage Vtn of said n-type MOS transistor forming the logic circuit when the pass-transistor logic circuit is in a non-operative mode than that in an operative mode; and a load circuit including a CMOS inverter having a p-type MOS transistor forming the CMOS inverter and an n-type MOS transistor forming the CMOS inverter which are connected in series between a first power source and a second power source, the p-type MOS transistor forming the CMOS inverter and the n-type MOS transistor forming the CMOS inverter having gate terminals supplied with the logic output signal forming the input of the CMOS inverter, the p-type MOS transistor forming the CMOS inverter and the n-type MOS transistor forming the CMOS inverter having a common connected point from which a load output signal is output and which forms the output of the CMOS inverter, and said p-type MOS transistor forming the CMOS inverter having a threshold voltage value whose absolute value |vtp| is larger than the threshold voltage Vtn of the n-type MOS transistor forming the logic circuit, the load circuit further including a feedback mechanism which does not function when the pass-transistor logic circuit is in the operative mode, but functions when the pass-transistor logic circuit is in the non-operative mode to supply the first power source to the input of the CMOS inverter when the logic output signal is high level.

DETAILED DESCRIPTION OF THE PREFERRED EMBODIMENTS (First Embodiment)

The semiconductor integrated circuit device according to the first embodiment is configured to ensure the threshold voltage of a p-type MOS transistor forming a CMOS inverter in a load circuit be relatively higher than the threshold voltage of an n-type MOS transistor forming a pass-transistor logic circuit to prevent a leak current even when an insufficiently high signal enters into the CMOS inverter.

Figure 1:
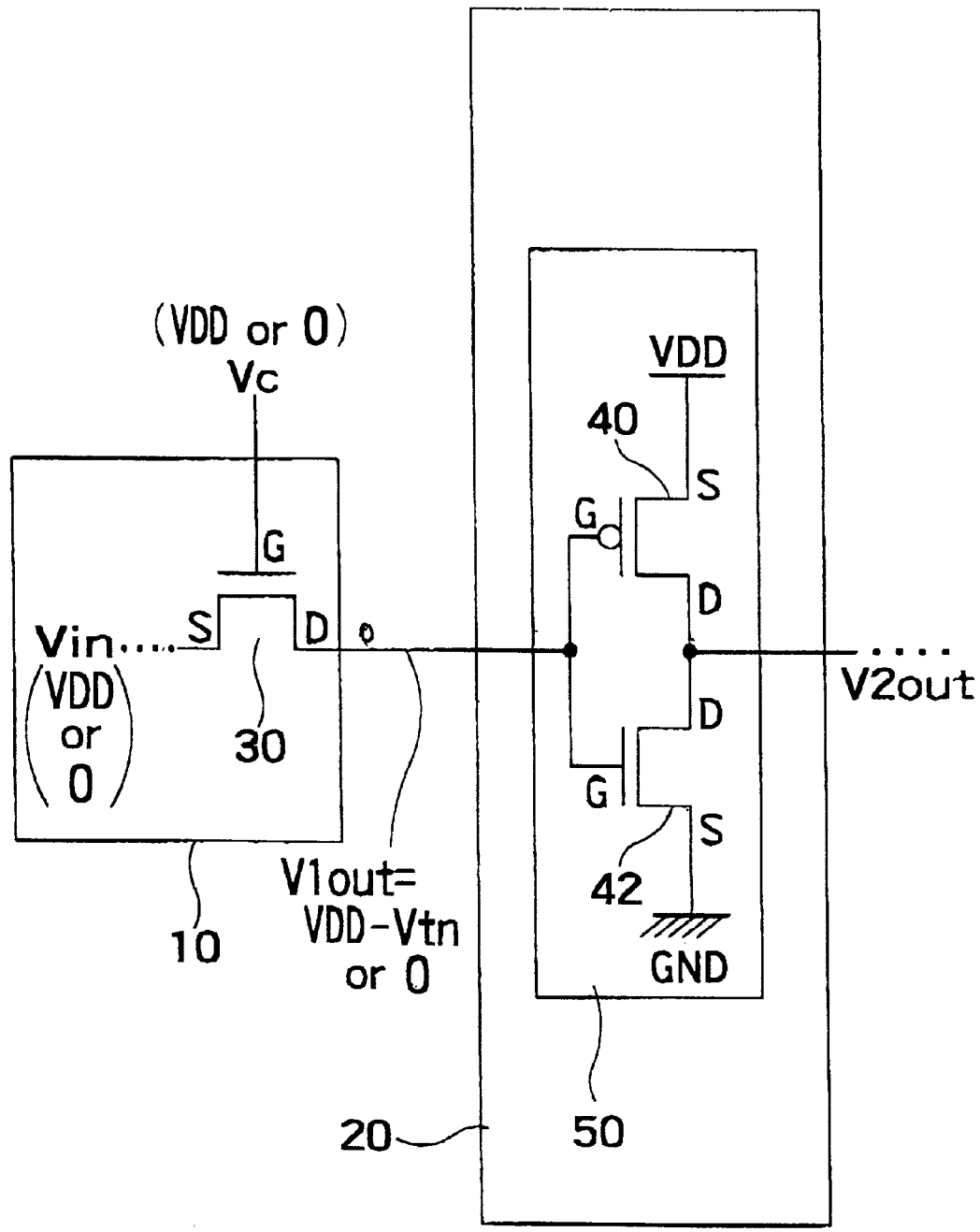
FIG. 1 is a view illustrating a semiconductor integrated circuit device according to the first embodiment of the invention.

FIG. 1 shows a circuit arrangement of the semiconductor integrated circuit device according to the first embodiment. As shown in FIG. 1, the semiconductor integrated circuit device includes a pass-transistor logic circuit 10 and a load circuit 20.

The pass-transistor logic circuit 10 is made up of a plurality of n-type MOS transistors to perform logic operation by combining these n-type MOS transistors. FIG. 1 shows only the last stage n-type MOS transistor 30 among these n-type MOS transistors. A voltage Vc is applied to the gate terminal G of then-type MOS transistor 30. The voltage Vc changes to the source voltage VDD or 0 V in accordance with the logic operation by the pass-transistor logic circuit 10. The source terminal S of the n-type MOS transistor 30 on the left side thereof on the drawing sheet is supplied with a voltage Vin. If the voltage swing of Vin equals that of Vc, then the voltage Vin becomes VDD or 0 V in response to the logic operation by the pass-transistor logic circuit 10. However, the voltage swing of Vc and that of Vin may be different Similarly to typical MOS transistors, the potential of the substrate of the n-type MOS transistor forming the pass-transistor logic circuit 10 is set to a ground voltage GND. The drain terminal D of the n-type MOS transistor 30 on the right side thereof on the drawing sheet is connected to the load circuit 20. Therefore, the output signal V1out from the pass-transistor logic circuit 10 is introduced into the load circuit 20.

The load circuit 20 includes a CMOS inverter 50 which includes a p-type MOS transistor 40 and an n-type MOS transistor 42. These p-type MOS transistor 40 and n-type MOS transistor 42 are serially connected between the source voltage VDD and the ground GND. That is, the source terminal S of the p-type MOS transistor 40 is connected to the source voltage VDD. The drain terminal D of the p-type MOS transistor 40 is connected to the drain terminal D of the n-type MOS transistor 42. The source terminal S of the n-type MOS transistor 42 is connected to ground GND. Gate terminals G, G of these both p-type MOS transistor 40 and n-type MOS transistor 42 are connected to the drain terminal D of the n-type MOS transistor 30 explained above. That is, these gate terminals G, G form an input of the CMOS inverter 50. Similarly to typical MOS transistors, the potential of the substrate of the p-type MOS transistor 40 is set to the source voltage VDD, and the potential of the substrate of the n-type MOS transistor 42 is set to the ground voltage GND. The common point of connection of the p-type MOS transistor 40 and the n-type MOS transistor 42 is connected to an external circuit, not shown. That is, the CMOS inverter 50 is configured to invert the output signal V1out from the pass-transistor logic circuit 10 and release it as the output signal V2out to the external circuit. Therefore, the load circuit 20 containing the CMOS inverter 50 functions as an output buffer.

In the circuit having the above-explained arrangement, the MOS transistors are so configured that the absolute value of the threshold voltage Vtp of the p-type MOS transistor 40 be larger than the threshold voltage Vtn of the n-type MOS transistor 30. That is, the MOS transistors are designed to ensure |Vtp|>Vtn. These MOS transistors can be realized, for example, by changing the impurity concentration of the source diffusion layer, drain diffusion layer and/or channel layer of the p-type MOS transistor 40 from the other transistors in the manufacturing process. The threshold voltage of the n-type MOS transistor 42 may either equal or differ from the threshold voltage Vtn of the n-type MOS transistor 30. In the embodiment shown here, their threshold voltage is Vtn so that impurity concentrations of source diffusion layers and drain diffusion layers and channel layers may be common among n-type MOS transistors made in a common substrate, aiming to reduce the number of steps of the manufacturing process.

Next explained are behaviors of the semiconductor circuit device shown in FIG. 1.

First considered is the case where the output signal V1out of the pass-transistor logic circuit is HIGH. In this case, the gate terminal G of the n-type MOS transistor 30 is supplied with the source voltage VDD. Also the source terminal S of the n-type MOS transistor 30 is supplied with the source voltage VDD.

Since the threshold voltage of the n-type MOS transistor 30 is Vtn, the voltage at the drain terminal D is VDD−Vtn. That Is, the voltage of the output signal V1out from the pass-transistor logic circuit 10 becomes VDD−Vtn. The output signal V1out is input to the gate terminal G of the p-type MOS transistor 40 and the gate terminal G of the n-type MOS transistor 42 in the CMOS inverter 50.

Assume here that the source voltage of the p-type MOS transistor 40 is Vs and the gate-source voltage is Vgs. Then, the gate-source voltage Vgs can be expressed as (VDD−Vtn)−Vs. The source voltage Vs equals the source voltage VDD. Therefore, the gate-source voltage vgs is −Vtn. However, as referred to above, the absolute value of the threshold voltage of the p-type MOS transistor 40 |Vtp| is larger than Vtn. That is, |Vtp|>Vtn is established. Therefore, the p-type MOS transistor 40 turns OFF, and the current is blocked. As a result, it is prevented that both the p-type MOS transistor 40 and the n-type MOS transistor 42 turn ON and cause a leak current to flow.

At that time, the n-type MOS transistor 42 turns ON. That is, with the voltage VDD−Vtn of the output signal V1out of the pass-transistor logic circuit 10, the n-type MOS transistor 42 gets in a sufficient ON state. Therefore, the output of the inverter 20 becomes LOW. That is, the load circuit 20 issues the output signal V2out of a low level.

Next considered is the case where the output signal V1out of the pass-translator logic circuit 10 is LOW. In this case, the source terminal S of the n-type MOS transistor 30 is supplied with 0 V.

When the output signal V1out of the pass-transistor logic circuit 10 is LOW, the voltage of the output signal V1out is 0 V. Therefore, the output signal V1out of 0 V is input to the gate terminal G of the p-type MOS transistor 40 and the gate terminal G of the n-type MOS transistor 42 in the CMOS inverter 50.

When 0 V is applied to the gate terminal G of the p-type MOS transistor 40, this transistor 40 gets in a sufficient ON state. Additionally, when 0 V is applied to the gate terminal G of the n-type MOS transistor 42, this transistor 42 gets in a sufficient OFF state. Therefore, output of the CMOS inverter 50 becomes HIGH. That is, the load circuit 20 issues the output signal V2out of a high level. Since the n-type MOS transistor 42 is in a sufficient OFF state, no leak current flows into the CMOS inverter 50.

As explained above, in the embodiment shown here, since the absolute value |Vtp| of the threshold voltage of the p-type transistor 40 in the CMOS inverter 50 is larger than the threshold voltage Vtn of the n-type MOS transistor 30 in the pass-transistor logic circuit 10, it is prevented that a leak current flows into the CMOS inverter 50 when the output signal V1out of the pass-transistor logic circuit 10 is HIGH. That is, when the output signal V1out of the pass-transistor logic circuit 10 is HIGH, the voltage of the output signal V1out becomes VDD−Vtn due to a drop by threshold voltage. Therefore, the gate-source voltage Vgs of the p-type MOS transistor 40 becomes−Vtn. However, because of the relation |Vtp|>Vtn, the p-type MOS transistor 40 turns off and blocks the current. As a result, it is reliably prevented that a leak current flows into the CMOS inverter 50.

Figure 11:
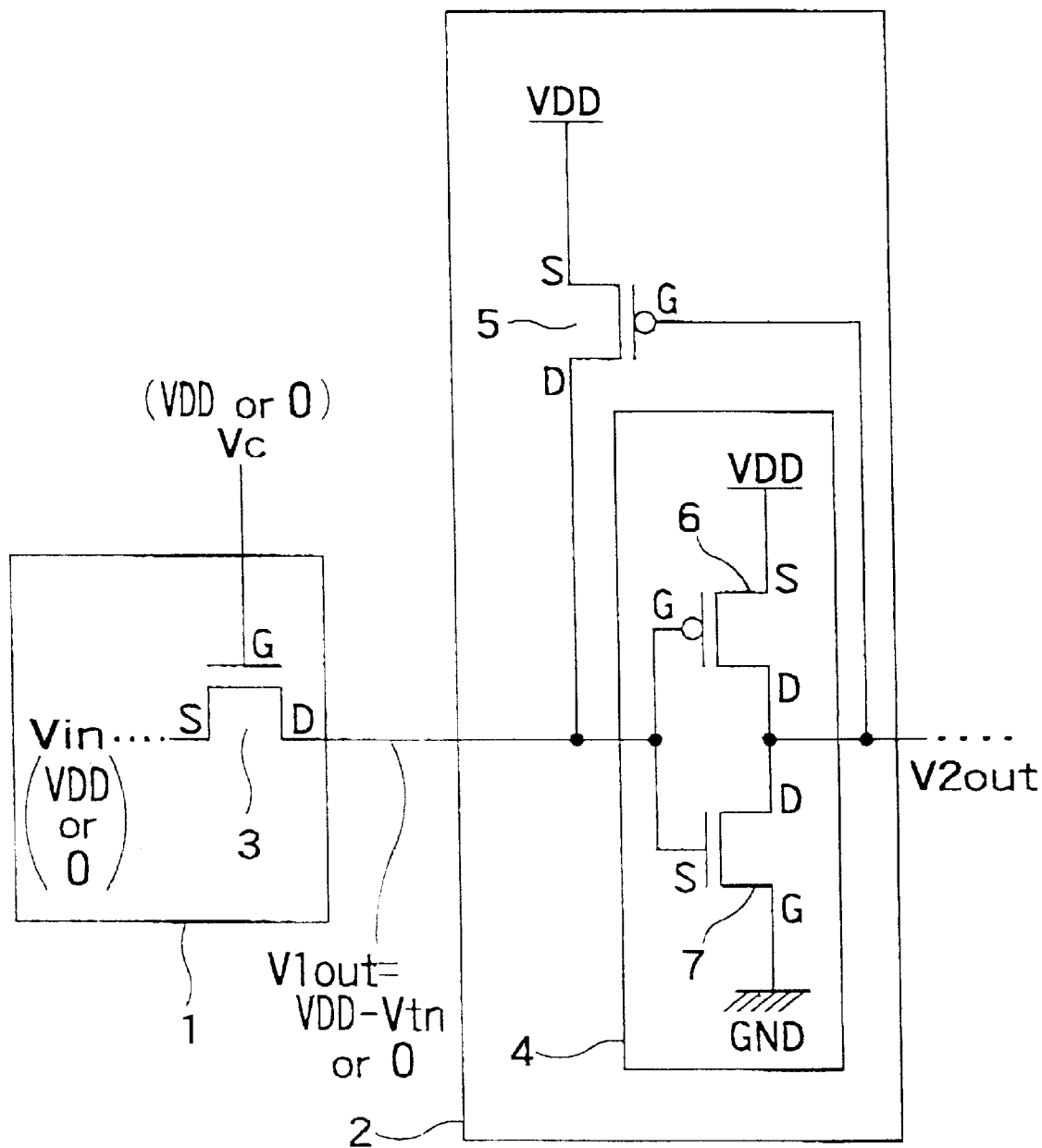
FIG. 11 is a view illustrating a conventional semiconductor integrated circuit device.
Figure 12:
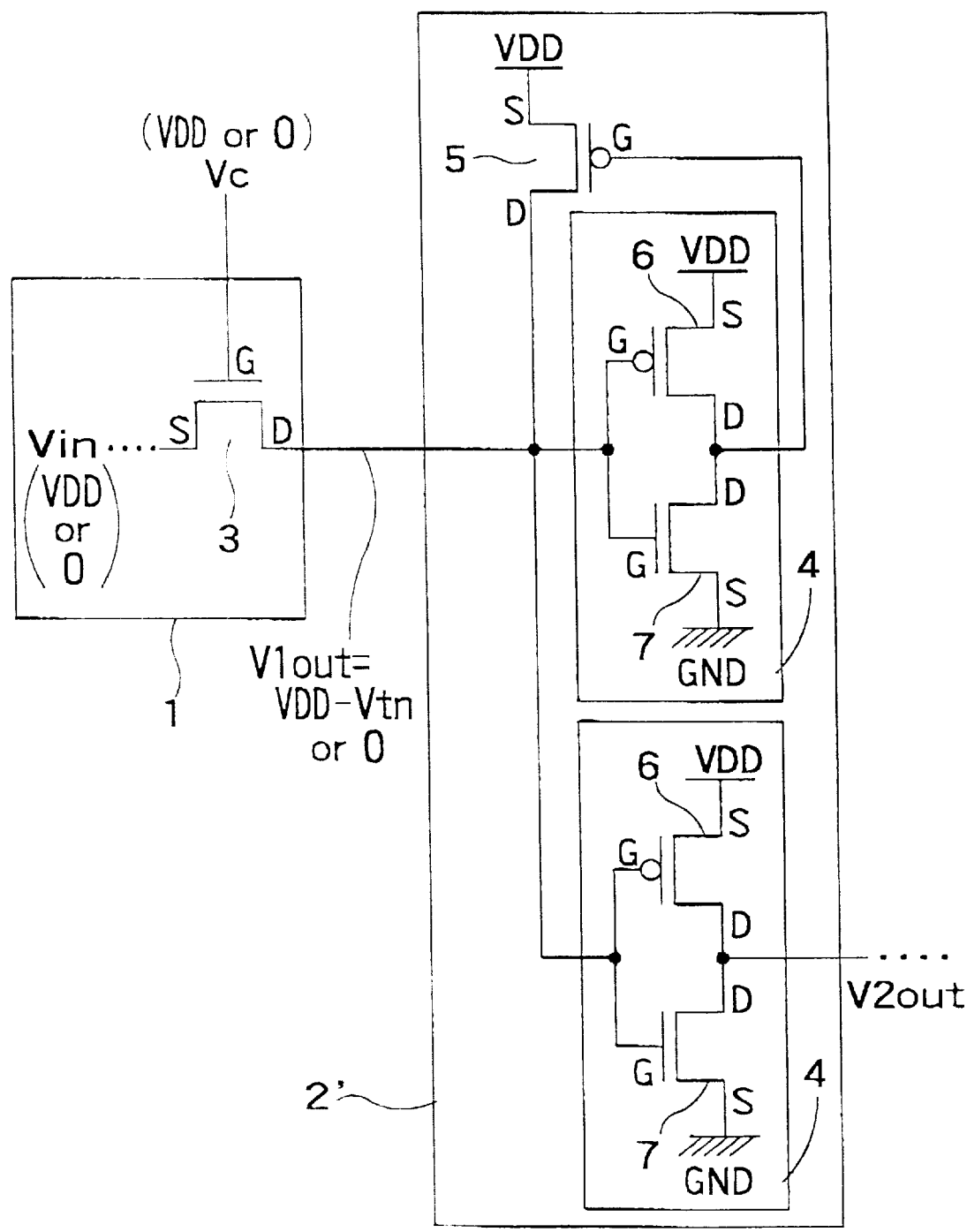
FIG. 12 is a view illustrating another conventional semiconductor integrated circuit device.

Further, the pass-transistor logic circuit 10 and the load circuit 20 can be made in a ratioless design by setting the threshold voltages as explained above. That is, it is not necessary to design the device such that the n-type transistor 3 for establishing the LOW state is stronger than the p-type MOS transistor 5 for establishing the HIGH state when the output signal V1out of the pass-transistor logic circuit 1 changes from HIGH to LOW, as explained with reference to FIG. 11 showing the conventional device. Therefore, the semiconductor integrated circuit device shown in FIG. 11 can be made immune from variance in the process for manufacturing LSIs. Moreover, since no MOS transistor for feedback purposes is used, high-speed operation is achieved, and the entire area of the semiconductor integrated circuit device can be reduced.

Actually, the output signal V1out of the pass-translator logic circuit 10 becomes lower than Vin-Vtn by 0.2 to 0.3 V due to a substrate bias effect. Further, for sufficiently blocking the p-type MOS transistor 40, the gate-source voltage |Vgs| of the p-type MOS transistor 40 must be larger than |Vtp| by approximately 0.2 V. Therefore, for more effectively blocking the current flowing into the p-type MOS transistor 40, |Vtp| should be larger than Vtn preferably by at least 0.3, or more preferably by 0.5 V or more.

(Second Embodiment)

The first embodiment has been explained as the voltage at the source terminal of the last-stage n-type MOS transistor in the pass-transistor logic circuit being equal to the voltage applied to the gate terminal. In the second embodiment, more specifically considered is the case where a plurality of n-type MOS transistors are serially connected in the pass-transistor logic circuit.

Figure 2:
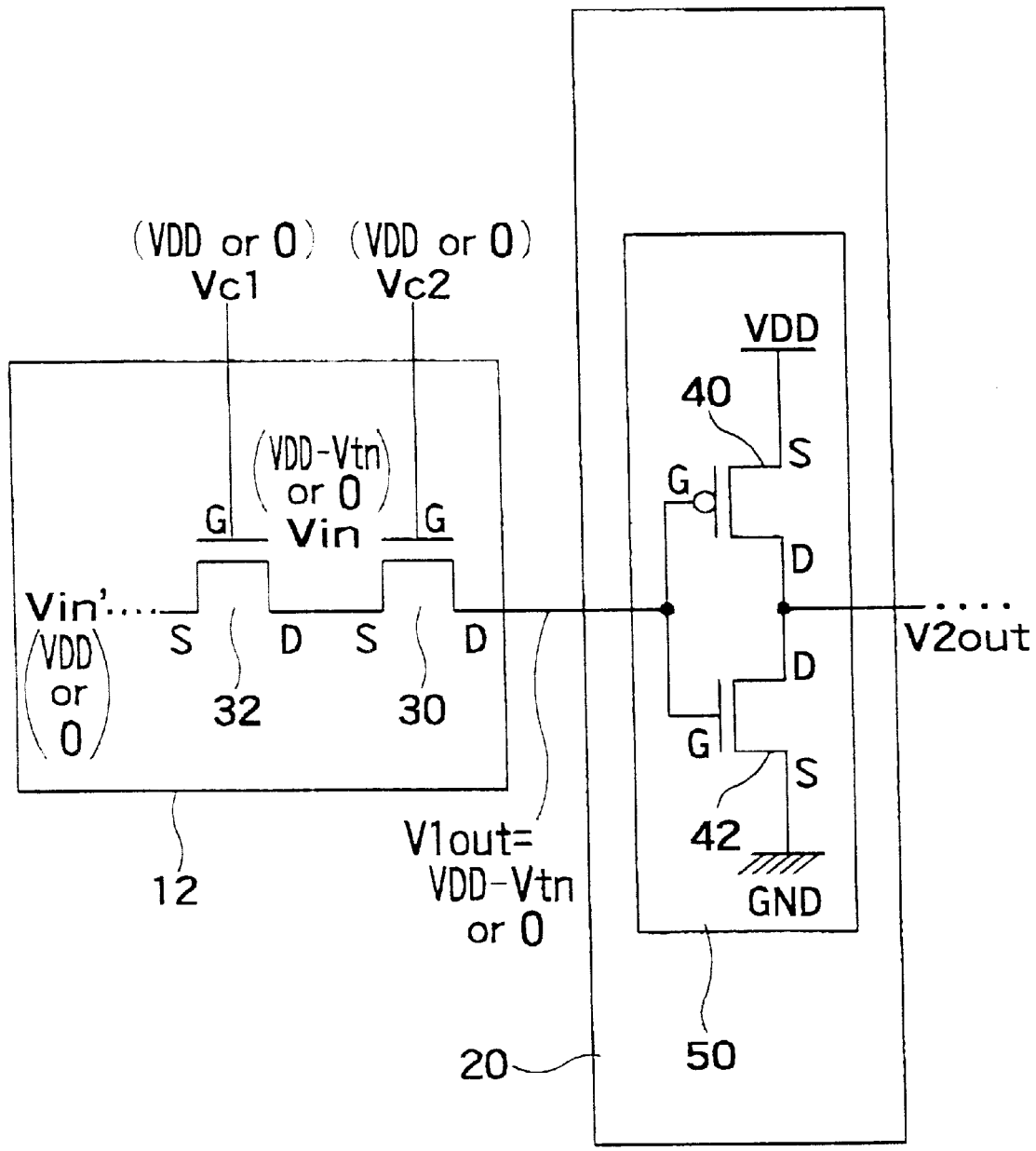
FIG. 2 is a view illustrating a semiconductor integrated circuit device according to the second embodiment of the invention.

FIG. 2 shows the semiconductor integrated circuit device according to the second embodiment of the invention. As shown in FIG. 2, the pass-transistor logic circuit 12 includes a plurality of n-type MOS transistors. FIG. 2 illustrates only the last-stage n-type MOS transistor 30 and the preceding n-type MOS transistor 32. Actually, the pass transistor logic circuit 12 includes a plurality of n-type MOS transistors connected in series or in parallel to perform various logic operations. Except for the concretized point, the semiconductor integrated circuit device according to the second embodiment is the same as the first embodiment in construction, and explanation on the common aspect is omitted here.

Next explained are behaviors of the semiconductor circuit device shown in FIG. 2. First considered is the case where the output of the pass-transistor logic circuit 12 is HIGH. The input signal Vin to the n-type MOS transistor 30 is the output from the n-type MOS transistor 32. Therefore, the input signal Vin can be expressed as Vc1−Vtn. If Vc1=Vc2=VDD, the voltage of the output signal V1out from the n-type MOS transistor 30 equals the input signal Vin thereof. That is, Vin=V1out=VDD−Vtn. As a result, even when n-type MOS transistors are connected to the pass-transistor logic circuit 12, the output signal V1out has the same voltage as the first embodiment.

That is, as explained with the first embodiment, the gate-source voltage Vgs of the p-type MOS transistor 40 in the CMOS inverter 50 is −Vtn. Then, since the absolute value |Vtp| of the threshold voltage of the p-type MOS transistor 40 is larger than the threshold voltage Vtn of the n-type MOS transistor 30, the p-type MOS transistor 40 gets in a sufficient off state. Therefore, no leak current flows into the CMOS inverter 50.

On the other hand, when the output of the pass-transistor logic circuit 12 is LOW, the voltage of the output signal V1out is 0 V. Therefore, the n-type MOS transistor 42 gets in a sufficient off state, and no leak current flows into the CMOS inverter 50.

In this manner, similarly to the semiconductor integrated circuit device according to the first embodiment, also in the semiconductor integrated circuit device according to the second embodiment, also when the output signal from the pass-transistor logic circuit 12 is HIGH, it is reliably prevented that a leak current flows into the CMOS inverter 50. That is, also when an arbitrary number of n-type MOS transistors are connected in series to the pass-transistor logic circuit 12, the same discussion as the first embodiment is applicable.

(Third Embodiment)

The semiconductor integrated circuit device according to the third embodiment of the invention is so configured that the absolute value |Vtp| of the threshold voltage of the p-type MOS transistor in the CMOS inverter be larger than the threshold voltage Vtn of the n-type MS transistor in the pass transistor logic circuit by controlling the substrate potential of the p-type MOS transistor in the CMOS inverter.

Figure 3:
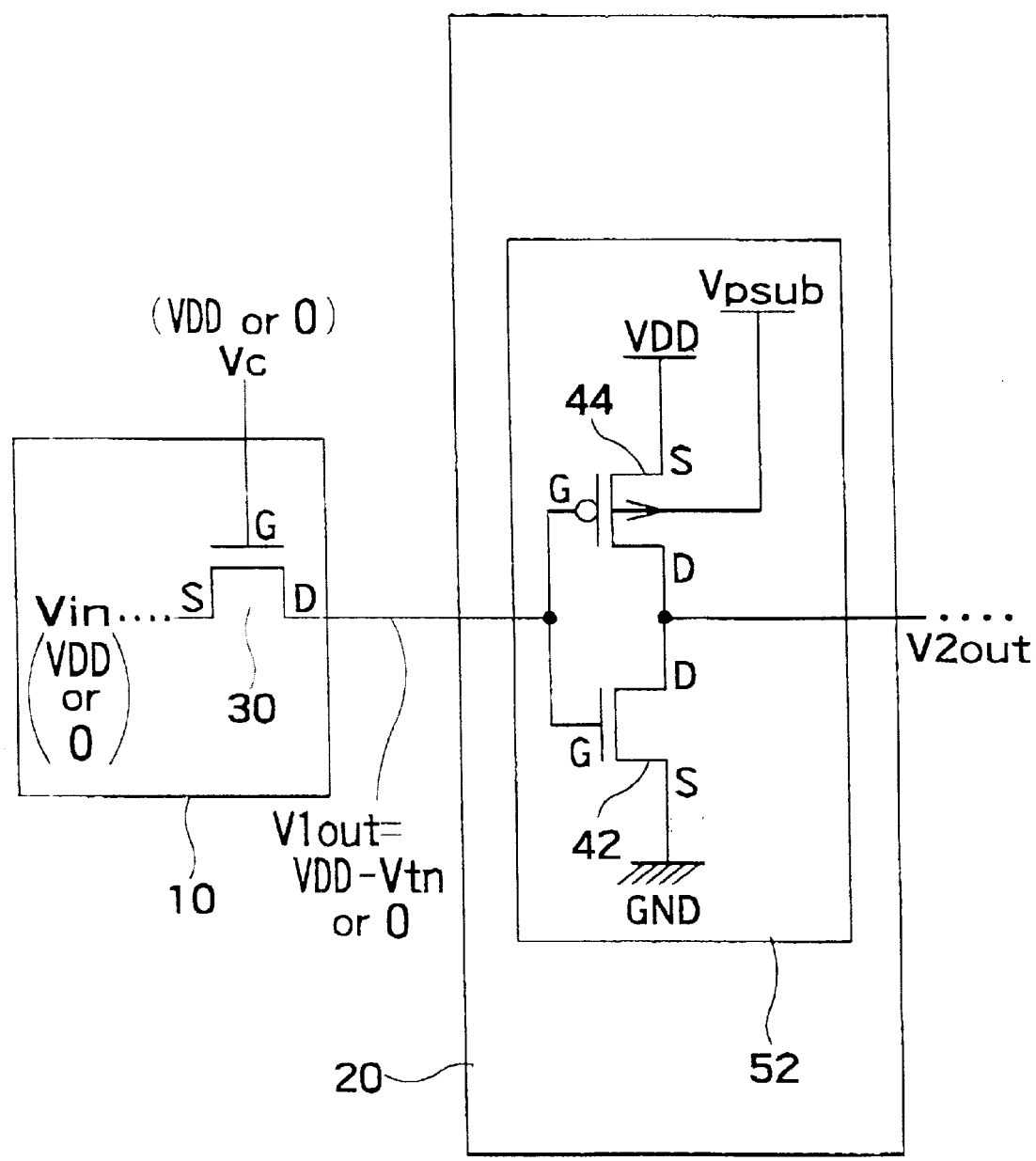
FIG. 3 is a view illustrating a semiconductor integrated circuit device according to the third embodiment of the invention.

FIG. 3 illustrates the semiconductor integrated circuit device according to the third embodiment of the invention. As shown in FIG. 3, the CMOS inverter 52 includes a p-type MOS transistor 44 and an n-type MOS transistor 42. The p-type MOS transistor 44 is independently supplied with a substrate voltage Vpsub for controlling the substrate potential. That is, in general, the source voltage VDD is applied as the substrate potential to the p-type MOS transistor, and the ground potential GND is applied to the n-type MOS transistor 44. In contrast, the p-type MOS transistor 44 is supplied with the substrate voltage Vpsub as the substrate potential. As the substrate potential of the n-type MOS transistor 42, the ground potential GND is applied like typical n-type MOS transistors. The substrate potential Vpsub is higher than the source voltage VDD. For example, if the source voltage VDD is 5 V, the substrate voltage Vpsub is 7V. Except for the feature that the substrate voltage Vpsub is independently applied to the p-type MOS transistor 44 in the CMOS inverter 52, the semiconductor integrated circuit device according to the third embodiment has the same construction as that of the first embodiment, its explanation is omitted here.

Next explained are behaviors of the semiconductor integrated circuit device shown in FIG. 3. First considered is the case where the output signal V1out of the pass-transistor logic circuit 10 is HIGH. In this case, as explained with the first embodiment, the voltage of the output signal V1out from the pass-transistor logic circuit 10 is VDD−Vtn. Since VDD−Vtn is input to the gate terminal G of the p-type MOS transistor 44 in the CMOS inverter 52, the gate-source voltage Vgs of the p-type MOS transistor 44 becomes −Vtn. The p-type MOS transistor 44 is supplied with the substrate potential Vpsub higher than the source voltage VDD. Therefore, the threshold voltage |Vtp| of the p-type MOS transistor 44 can be made larger than Vtn. As a result, even when −Vtn is applied between the gate and the source of the p-type MOS transistor 44, this transistor 44 turns OFF. Because the p-type MOS transistor turns OFF, no leak current flows into the CMOS inverter 52

On the other hand, when the output of the pass-transistor logic circuit is LOW, the voltage of the output signal V1out becomes 0 V. Therefore, the n-type MOS transistor 42 gets in a sufficient off state, and no leak current flows into the CMOS inverter 52 here again.

As explained above, according to the embodiment shown here, since the threshold voltage Vtp of the p-type MOS transistor 44 is controlled by independently applying the substrate potential Vpsub for substrate potential control to the p-type MOS transistor 44, the circuit can be designed as both the p-type MOS transistor 44 and the n-type MOS transistor 42 forming the CMOS inverter 52 being substantial equal in absolute value of their threshold voltages. That is, the circuit can be designed as the threshold voltage |Vtp| of the p-type MOS transistor 44 being approximately equal to the threshold voltage of the n-type MOS transistor 42 like those in typical CMOS logic circuits.

Moreover, since the basic structure of the p-type MOS transistor 44 may be the same as the basic structure of the other p-type MOS transistors, the number of steps in the manufacturing process can be reduced. That is, in the first embodiment, as shown in FIG. 1, the p-type MOS transistor 40 is different from the n-type MOS transistor 42 and the other p-type MOS transistors in basic structure such as impurity concentration so that the threshold voltage of the former be different from others. In the third embodiment, however, since the difference in threshold voltage is made by controlling the substrate potentials, the p-type MOS transistor 44 and the p-type MOS transistor used in another place may be the same in basic structure. Therefore, the manufacturing process can be simplified, and the CMOS logic circuit and the pass-transistor logic circuit can be incorporated easily. In other words, since p-type MOS transistors in a common chip may be common in threshold voltage, LSIs can be manufactured economically.

(Fourth Embodiment)

The semiconductor integrated circuit device according to the fourth embodiment of the invention is a version made by adding a feedback loop to the load circuit in the first embodiment and by providing additional MOS transistors for cutting the loop in order to reliably change the p-type MOS transistor of the CMOS inverter to a sufficient off state by using the feed back loop in the non-operative mode of the pass-transistor logic circuit and to increase the operation speed by cutting the feed back loop in the operative mode.

Figure 4:
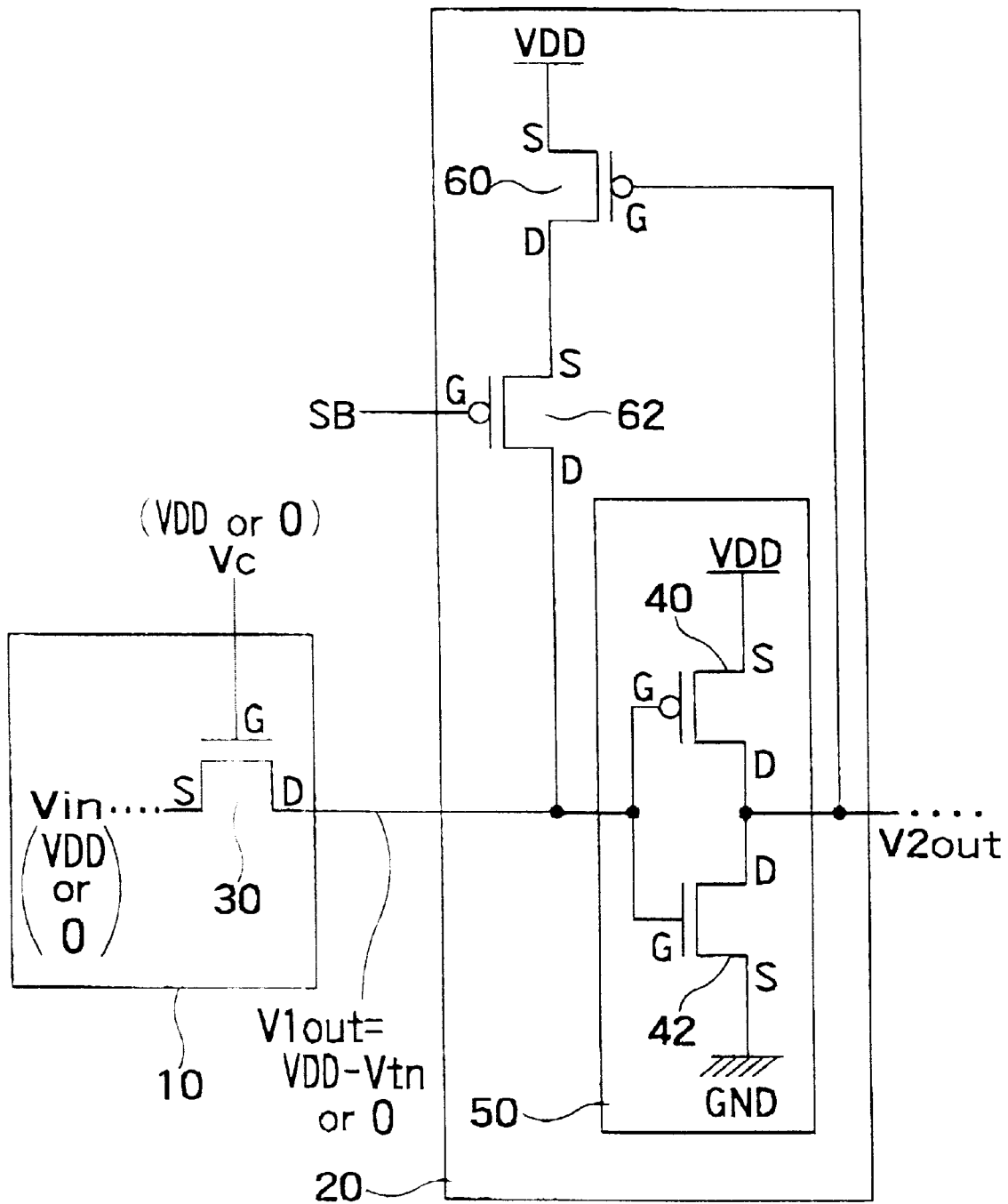
FIG. 4 is a view illustrating a semiconductor integrated circuit device according to the fourth embodiment of the invention.

FIG. 4 illustrates the semiconductor integrated circuit device according to the fourth embodiment of the invention. As shown in FIG. 4, the fourth embodiment includes a feedback mechanism from the output side to the input side of the CMOS inverter 50. The feedback mechanism is made up of a loop including p-type MOS transistors 60 and 62.

The gate terminal G of the p-type MOS transistor 60 is connected to the output of the CMOS inverter 50. The source terminal S of the p-type MOS transistor 60 is connected to the source voltage VDD, and the drain terminal D thereof is connected to the source terminal S of the p-type MOS transistor 62. The gate terminal G of the p-type MOS transistor 62 is supplied with a stand-by signal SB. The drain terminal D of the p-type MOS transistor 62 is connected to the input of the CMOS inverter 50. The stand-by signal SB is HIGH in the operative mode where the pass-transistor logic circuit 10 executes various logic operations. On the other hand, in the non-operative mode where the pass-transistor logic circuit 10 does no operation, the stand-by signal is LOW. That is, the stand-by signal becomes LOW when a stand-by state without logic operation continues. By controlling the stand-by signal SB in this manner, the p-type MOS transistor 62 is turned ON or OFF to cut the feedback loop in the operative mode and to connect the feedback loop in the non-operative mode.

Except for these features, the semiconductor integrated circuit device according to the fourth embodiment has the same construction as the semiconductor integrated circuit device according to the first embodiment, and its explanation is omitted here.

Next explained are behaviors of the semiconductor integrated circuit device shown in FIG. 4. First considered is the case where the output signal V1out from the pass-transistor logic circuit 10 is HIGH. In this case, as explained with the first embodiment, the voltage of the output signal V1out is VDD−Vtn. This is applied to gate terminals C, G of the p-type MOS transistor 40 and the n-type MOS transistor 42 in the CMOS inverter 50. The absolute value |Vtp| of the threshold voltage of the p-type MOS transistor 40 is larger than the threshold voltage Vtn of the n-type MOS transistor 30. Basically, therefore, the p-type MOS transistor 40 turns OFF. On the other hand, the n-type MOS transistor 42 turns ON. As a result, the output of the CMOS inverter 50 is LOW.

However, due to variance in threshold voltage in the p-type MOS transistor 40, the p-type MOS transistor 40 may fail to get in a sufficient off state. In this case, since the n-type MOS transistor 42 is ON, a leak current, even if small, may flow through the p-type MOS transistor 40- That is, a slight leak current may flow into the CMOS inverter 50.

If the leak current flows in the non-operative mode, a large power is consumed even though no logic operation is done. To overcome the problem, the fourth embodiment uses the feedback mechanism. More specifically, since the output of the CMOS inverter 50 is LOW, the p-type MOS transistor 60 turns ON. When the pass-transistor circuit 10 is in the non-operative mode, the stand-by signal SB becomes LOW, and the p-type MOS transistor 62 turns ON. Therefore, the source voltage VDD is supplied from the source terminal S of the p-type MOS transistor 60 to the input of the CMOS inverter 50. The source voltage VDD changes the p-type MOS transistor 40 to a sufficient off state. That is, even when the threshold voltage of the p-type MOS transistor 40 varies, the source voltage VDD establishes a sufficient off state. As a result, the leak current flowing in the p-type MOS transistor 40 can be blocked.

In the operative mode, however, the stand-by signal SB becomes HIGH. Therefore, the p-type MOS transistor 62 turns OFF, and the loop is cut. As a result, the semiconductor integrated circuit device shown in FIG. 4 becomes equivalent to the semiconductor integrated circuit device shown in FIG. 1, and operates in the same manner. In this mode, a slight leak current may flow through the p-type MOS transistor 40 due to a variance in threshold voltage Vtp of the p-type MOS transistor 40. However, the leak current is small, and its flow, if any in the operative mode, will be a practically negligible level.

When the output of the pass-transistor logic circuit 10 is LOW, the voltage of the output signal V1out is 0 V. Therefore, regardless of the operative mode or the non-operative mode, the n-type MOS transistor 42 becomes a sufficient OFF state, and no leak current flows in the CMOS inverter 50.

As explained above, according to the semiconductor integrated circuit device shown here, since the feedback mechanism is used, leak current flowing in the p-type MOS transistor 40 in the CMOS inverter 50 can be minimized even under a variance in threshold voltage of the p-type MOS transistor 40.

Furthermore, since the feedback loop is cut in the operative mode of the pass-transistor logic circuit 10, and it is connected only in the non-operative mode, leak current flowing in the CMOS inverter 50 can be prevented while ensuring the operation speed during operation.

Additionally, since the power supply from the source voltage VDD connected to the source terminal S of the p-type MOS transistor 60 is cut in the operative mode, it is prevented that a short-circuit current flows through the n-type MOS transistor 30 as in the conventional device when the output signal V1out of the pass-transistor logic circuit 10 changes from HIGH to LOW. As a result, the semiconductor integrated circuit device can be made in a ratioless design.

Figure 5:
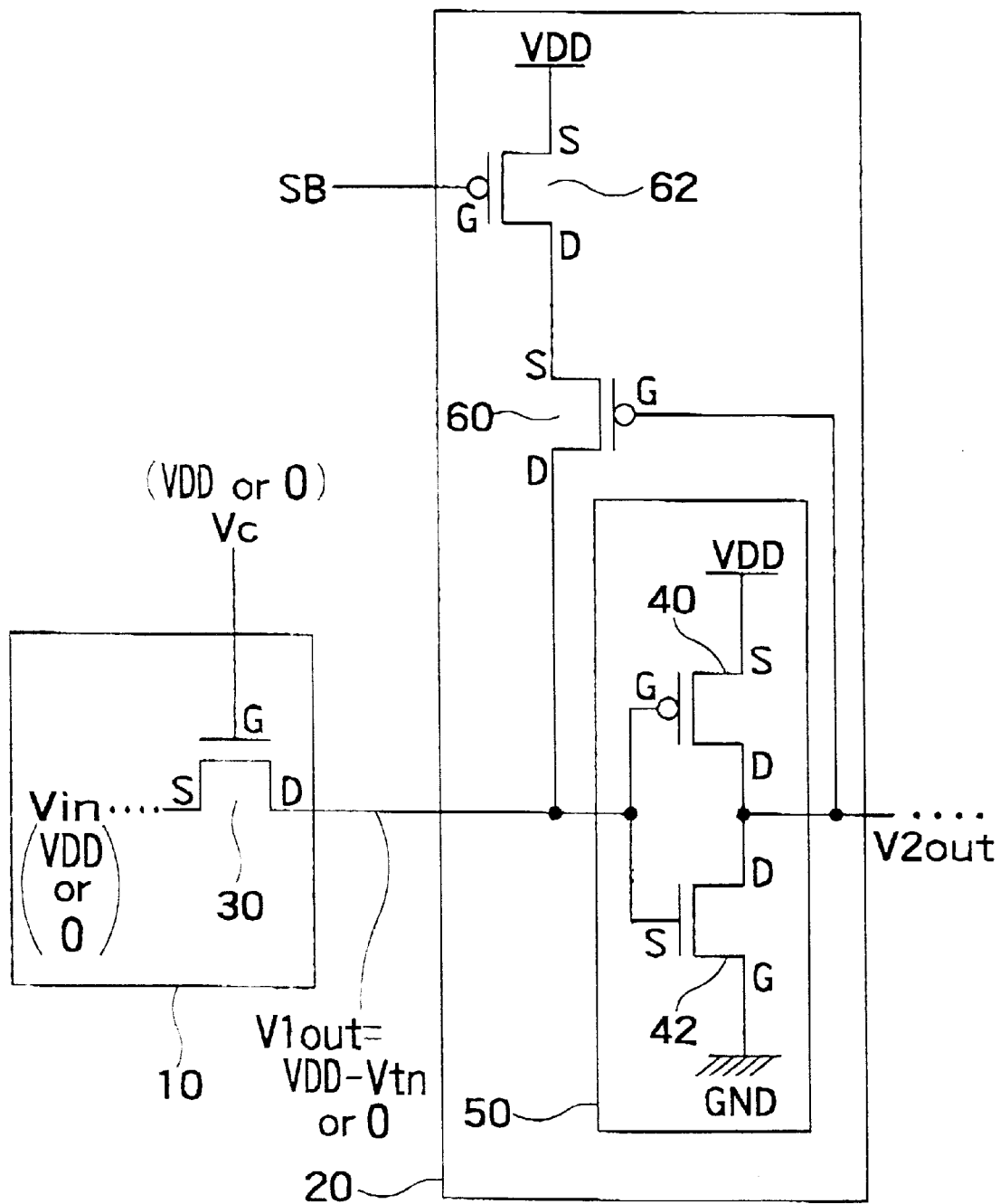
FIG. 5 is a view illustrating a modification of the semiconductor integrated circuit device according to the fourth embodiment of the invention.

In the fourth embodiment, the p-type MOS transistors 60 and 62 may change their positions each other as shown in FIG. 5. However, the arrangement of FIG. 5 is inferior to the arrangement of FIG. 4 in operation speed because the p-type MOS transistor 60 turn On or OFF in the operative mode and causes an increase in number of MOS transistors concerned in the operation.

(Fifth Embodiment)

The fifth embodiment is directed to a version where CMOS inverters are provided in two stages in the load circuit to prevent a flow of a leak current into the p-type MOS transistor of the first-stage CMOS inverter by feeding the output of the second-stage CMOS inverter to the input of the first-stage CMOS inverter in the non-operative mode.

Figure 6:
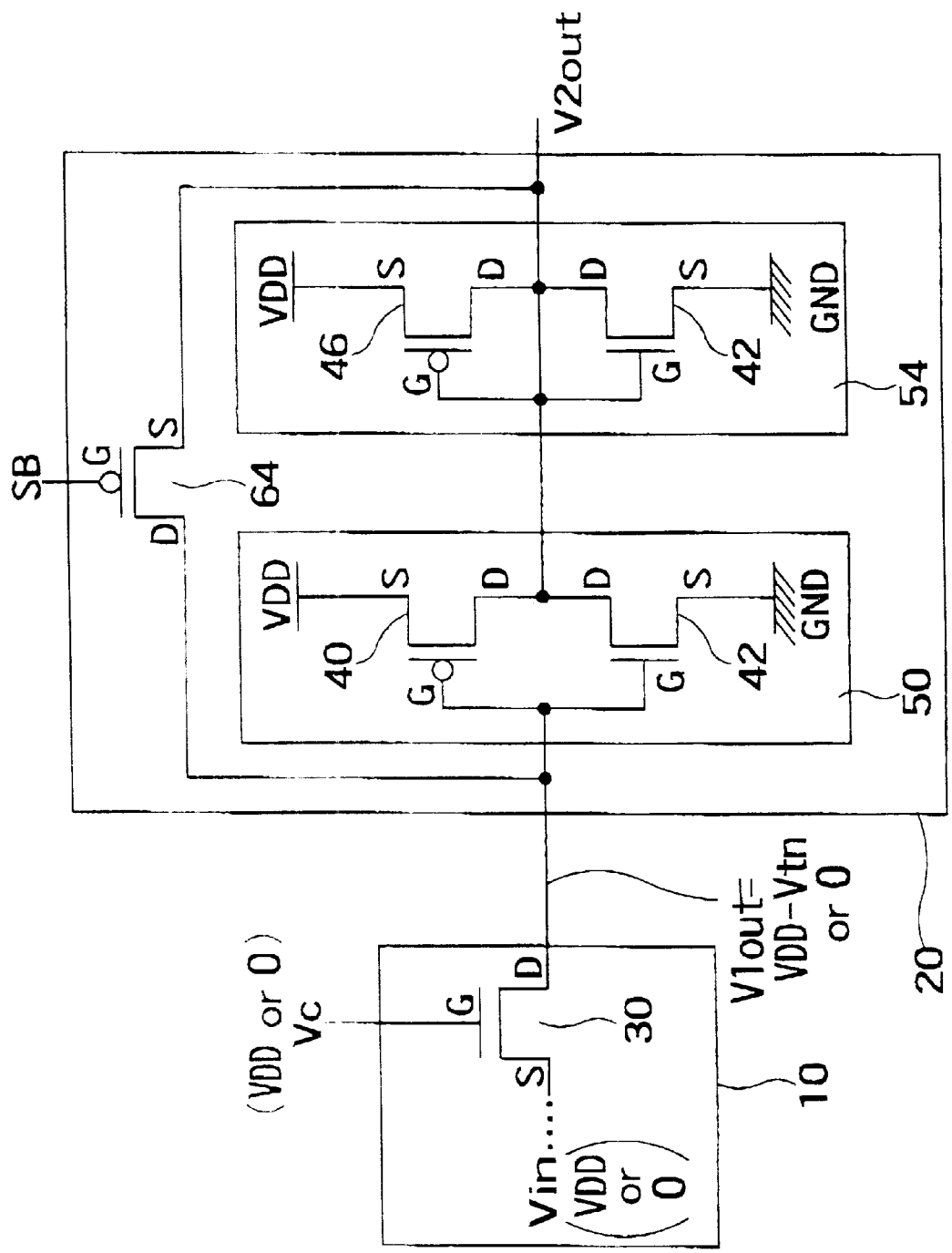
FIG. 6 is a view illustrating a semiconductor integrated circuit device according to the fifth embodiment of the invention.

FIG. 6 illustrates the semiconductor circuit device according to the fifth embodiment. As shown in FIG. 6, the load circuit 20 includes a first inverter made up of a CMOS inverter 50 and a second inverter made up of a CMOS inverter 54. One of the CMOS inverters, 50, has a structure equivalent to that used in the first embodiment. That is, it is so configured that the absolute value |Vtp| of the threshold voltage of the p-type MOS transistor 40 be larger than the threshold voltage Vtn of the n-type MOS transistor 30 in the pass-transistor logic circuit 10.

In contrast, the CMOS inverter 54 is so configured that the absolute value |Vtp2| of the threshold voltage of the p-type MOS transistor 46 be equivalent to the threshold voltage of the n-type MOS transistor 30. It is also possible, however, to determine the threshold voltage |Vtp2| of the p-type MOS transistor being as large as the threshold voltage |Vtp| of the p-type MOS transistor 40. That is, the threshold voltage |Vtp2| of the p-type MOS transistor 46 may be equal to the threshold voltage |Vtp| of the p-type MOS transistor 40.

Output of the CMOS inverter 54 is fed back to the input of the CMOS inverter 50. The feedback mechanism includes a p-type MOS transistor 64 whose gate terminal G is supplied with a stand-by signal SB. The stand-by signal SB is HIGH in the operative mode where the pass-transistor logic circuit 10 performs various logic operations, similarly to the fourth embodiment. In the non-operative mode where the pass-transistor logic circuit 10 does not operate, the stand-by signal is LOW. That is, the stand-by state without logic operation continues, the stand-by signal becomes LOW. By controlling the stand-by signal SB in this manner, the p-type MOS transistor 64 is turned ON or OFF to cut the feedback loop in the operative mode and to connect the feedback loop in the non-operative mode.

Except for these features, the semiconductor integrated circuit device according to the fifth embodiment has the same construction as the semiconductor integrated circuit device according to the first embodiment, and its explanation is omitted here.

Next explained are behaviors of the semiconductor integrated circuit device shown in FIG. 5. First considered is the case where the pass-transistor logic circuit 10 is in the operative mode. In this case, since the stand-by signal SB is HIGH, the p-type MOS transistor 64 turns OFF. Therefore, the feedback loop is cut, and the load circuit 20 operates as the CMOS inverters 50, 54 being serially connected in two stages. That is, if the output signal V1out of the pass-transistor logic circuit is HIGH, also the output signal V2out of the load circuit 20 is HIGH. When the output signal V1out of the pass-transistor logic circuit 10 is LOW, also the output signal V2out of the load circuit 20 is LOW.

In greater detail, when the output signal V1out of the pass-transistor logic circuit 10 is HIGH, the voltage of the output signal V1out is VDD−Vtn as explained with the first embodiment. This is applied to gate terminals G, G of the p-type MOS transistor 40 and the n-type MOS transistor 42 in the CMOS inverter 50. The absolute value |Vtp| of the threshold voltage of the p-type MOS transistor 40 is larger than the threshold voltage Vtn of the n-type MOS transistor 30. Basically, therefore, the p-type MOS transistor 40 turns OFF, and the n-type MOS transistor 42 turns ON. As a result, output of the CMOS inverter 50 is LOW.

The low level of the output from the CMOS inverter 50 is sufficiently low, that is 0 V. Therefore, the n-type MOS transistor 42 in the CMOS inverter 54 exhibits a sufficiently OFF state, and the p-type transistor 46 exhibits a sufficient ON state. Thus, the output of the CMOS inverter 54 becomes HIGH. Since the HIGH voltage is the source voltage VDD, and the n-type MOS transistor 42 is in a sufficient OFF state, no leak current flows in the CMOS inverter 54.

On the other hand, when the output signal V1out of the pass-transistor logic circuit 10 is LOW, the voltage of the output signal V1out becomes 0 V as explained with the first embodiment. This is applied to the gate terminal G of the p-type MOS transistor 40 and the gate terminal G of the n-type MOS transistor 42 in the CMOS inverter 50. Therefore, the p-type MOS transistor 40 makes a sufficiently ON state, and the n-type MOS transistor 42 makes a sufficiently OFF state. As a result, the output of the CMOS inverter 50 becomes HIGH. The HIGH voltage is the source voltage VDD. Additionally, since the n-type MOS transistor 42 is in a sufficiently OFF state, no leak current flows into the CMOS inverter 50.

Since the high level of the output from the CMOS inverter 50 is the high level of the source voltage VDD, the n-type MOS transistor 42 in the CMOS inverter 54 gets in a sufficiently ON state, and the p-type MOS transistor 46 exhibits a sufficiently OFF state. As a result, the output of the CMOS inverter 54 becomes LOW, that is, 0 V. Moreover, since the p-type MOS transistor 46 is in a sufficiently OFF state, no leak current flows into the CMOS inverter 54.

The above discussion has been made, on the case where the pass-transistor logic circuit 10 is in the operative mode. Next considered is the case where the pass-transistor logic circuit 10 is in the non-operative mode. In this case, since the stand-by signal SB is LOW, the p-type MOS transistor 64 turns ON. Therefore, the feedback loop is connected. As a result, the output of the CMOS inverter 54 is fed back to the input of the CMOS inverter 50. However, the basic behaviors are the same as those in the operative mode. That is, when the output signal V1out from the pass-transistor logic circuit 10 is HIGH, also the output signal V2out from the load circuit 20 is HIGH. When the output signal V1out from the pass-transistor logic circuit 10 is LOW, also the output signal V2out from the load circuit 20 is LOW.

In greater detail, when the output signal V1out of the pass transistor logic circuit 10 is HIGH, the voltage of the output signal V1out is VDD−Vtn as explained before. This is applied to gate terminals of the p-type MOS transistor 40 and the n-type MOS transistor 42 in the CMOS inverter 50. The absolute value |Vtp| of the threshold voltage of the p-type MOS transistor 40 is larger than the threshold voltage Vtn of the n-type MOS transistor 30. Basically, therefore, the p-type MOS transistor 40 turns OFF. On the other hand, the n-type MOS transistor 42 turns ON. As a result, the output of the CMOS inverter 50 becomes LOW.

The low level of the output from the CMOS inverter 50 is sufficiently low, that is, 0 V. Therefore, the n-type MOS transistor 42 in the CMOS inverter 54 exhibits a sufficiently OFF state, and the p-type transistor 46 exhibits a sufficiently ON state. As a result, the output of the CMOS inverter 54 becomes HIGH. The high voltage is the source voltage VDD. Moreover, since the n-type MOS transistor 42 is in a sufficiently OFF state, no leak current flows into the CMOS inverter 54.

However, due to a variance in threshold voltage in the CMOS inverter 50, the p-type MOS transistor 40 may fail to get in a sufficiently OFF state. In this case, since the n-type MOS transistor 42 is ON, a leak current, even if small, may flow through the p-type MOS transistor 40. That is, a slight leak current may flow into the CMOS inverter 50. If the leak current flows in the non-operative mode, a large power is consumed even though no logic operation is done.

To overcome the problem, the fifth embodiment uses the feedback mechanism. More specifically, since the current mode is the non-operative mode, the p-type MOS transistor 64 is ON. Therefore, the high level of the source voltage VDD of the CMOS inverter 54 is applied to the input of the CMOS inverter 50. As a result, the p-type MOS transistor 40 in the CMOS inverter 50 gets in a sufficiently OFF state. That is, even under a variance in threshold voltage Vtp of the p-type MOS transistor 40, the p-type MOS transistor 40 can establish a sufficiently OFF state with application of the high level of the source voltage to the gate terminal G of the p-type MOS transistor 40. As a result, the leak current flowing through the p-type MOS transistor 40 can be blocked.

When the output signal V1out of the pass-transistor logic circuit 10 is LOW, the voltage of the output signal V1out becomes 0 V as explained with the first embodiment. This is applied to the gate terminal G of the p-type MOS transistor 40 in the CMOS inverter 50 and to the gate terminal G of the n-type MOS transistor 42. Therefore, the p-type MOS transistor 40 exhibits a sufficiently ON state, and the n-type MOS transistor 42 exhibits a sufficiently OFF state. As a result, the output of the CMOS inverter 50 becomes HIGH. The high voltage is the source voltage VDD. Moreover, since the n-type MOS transistor 42 is sufficiently ON, no leak current flows into the CMOS inverter 50. The high level of the output from the CMOS inverter 50 is sufficiently high, i.e., the high level of the source voltage VDD. Therefore, the n-type MOS transistor 42 in the CMOS inverter 54 establishes a sufficiently ON state, and the p-type MOS transistor 46 establishes a sufficiently OFF state. As a result, the output of the CMOS inverter 54 becomes LOW, namely, 0 V. Moreover, since the p-type MOS transistor 46 is in a sufficiently OFF state, no leak current flows into the CMOS Inverter 54. Also when the pass-transistor logic circuit 10 is in the operative mode, a slight leak current may flow into the CMOS inverter 50. However, the leak current is very small, and its flow, if any in the operative mode, will be a practically negligible level.

As explained above, according to the embodiment shown here, since the semiconductor integrated circuit device includes the feedback mechanism, the leak current flowing into the p-type MOS transistor 40 in the CMOS inverter 50 can be minimized even if there is a variance in threshold voltage of the p-type MOS transistor 40.

Furthermore, since the loop of the feedback mechanism is cut in the operative mode of the pass transistor logic circuit 10 and connected only in the non-operative mode, the leak current flowing into the CMOS inverter 50 can be prevented while maintaining the high operation speed in the operative mode.

Additionally, since the p-type MOS transistor 64 is turned OFF in the operative mode, it is prevented that a short-circuit current flows through the n-type MOS transistor 30 from the HIGH side of the CMOS inverter 54 when the output signal V1out of the pass-transistor logic circuit 10 changes from HIGH to LOW.

(Sixth Embodiment)

The sixth embodiment is directed to a version modified from the fourth embodiment to control the substrate potential of an n-type MOS transistor forming the n-type MOS transistor and thereby ensure a high-speed operation of the pass-transistor logic circuit in the operative mode while decreasing a continuous leak current in the pass-transistor logic circuit in the non-operative mode.

Figure 7:
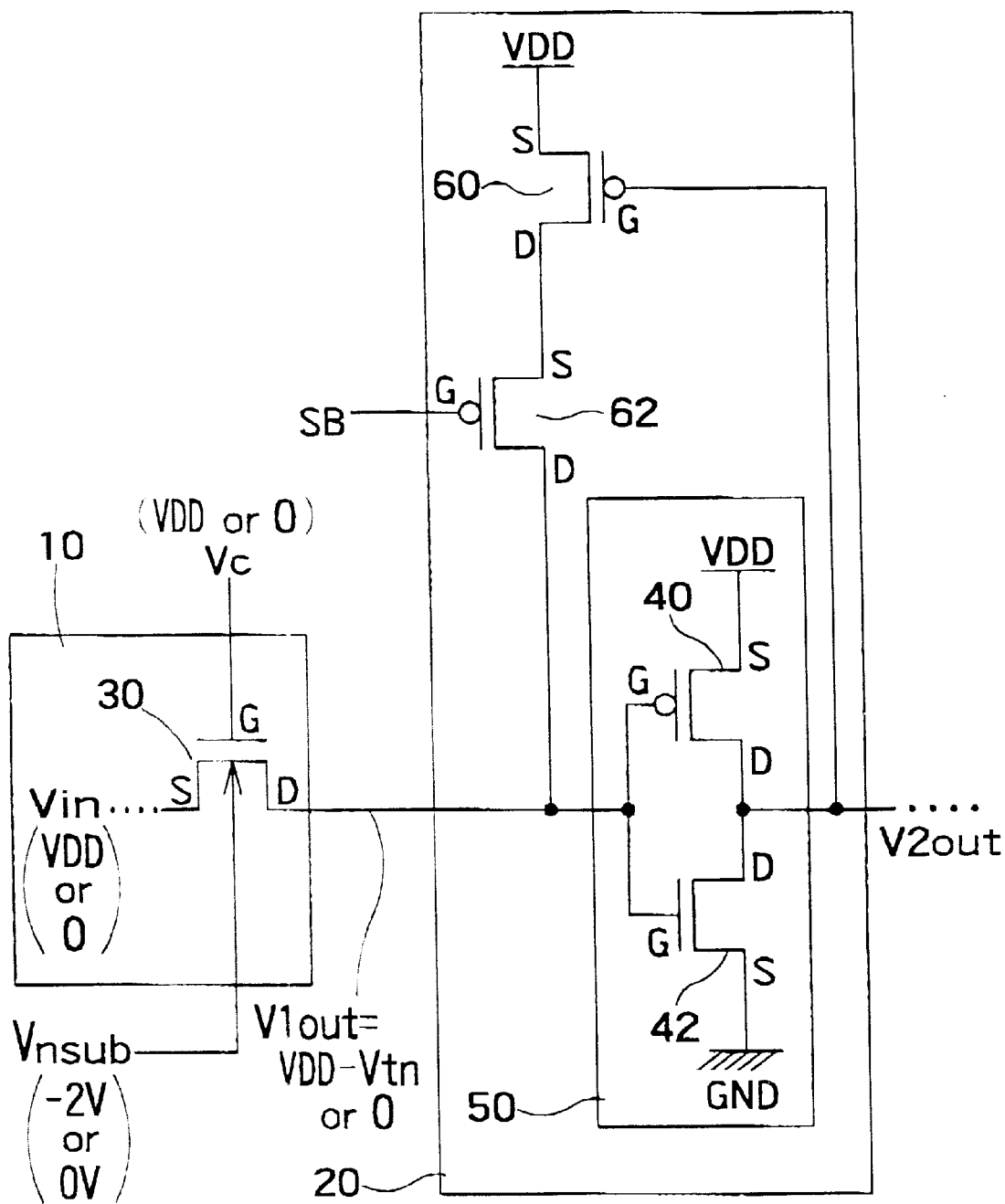
FIG. 7 is a view illustrating a semiconductor integrated circuit device according to the sixth embodiment of the invention.

FIG. 7 illustrates the semiconductor integrated circuit device according to the sixth embodiment. As shown in FIG. 7, the n-type MOS transistor forming the pass-transistor logic circuit 10 is independently supplied with a substrate potential control signal Vnsub. This is applied for the purpose of lowering the threshold voltage of the n-type MOS transistor in the pass-transistor logic circuit 10 in the operative mode and elevating it in the non-operative mode.

In greater detail, it has been known that the threshold voltage of the n-type MOS transistor forming the pass-transistor logic circuit 10 large affects the operation speed of the pass-transistor logic circuit. In order to increase the operation speed of the pass-transistor logic circuit 10, the threshold voltage of the r-type MOS transistor must be low. However, if the threshold voltage of the n-type MOS transistor is low, then a continuous leak current will flow even when the pass-transistor logic circuit 10 does not operate. That is, a leak current inevitably flows in the pass transistor logic circuit 10, and increases the power consumption in the non-operative mode, i.e. in the stand-by mode. To avoid it, the threshold voltage of the n-type MOS transistor is raised only in the non-operative mode. For this purpose, the embodiment shown here sets the substrate potential control signal Vnsub of the n-type MOS transistor to the ground potential GND in the operative mode and to a negative potential, −2 V, in the non-operative mode. By increasing the threshold voltage of the n-type MOS transistor, the leak current continuously flowing in the pass-transistor logic circuit 10 can be reduced.

Along with the increase in threshold voltage of the n-type MOS transistor in the pass transistor logic circuit 10 in the non-operative mode, the following problem arises. That is, in the non-operative mode, the larger threshold voltage of the n-type MOS transistor 30 in the pass-transistor logic circuit 10 causes larger drops in the non-operative mode, and results in increasing the leak current flowing in the CMOS inverter 50 within the load circuit 20. This is because, although the high-level voltage of the output signal V1out of the pass-transistor logic circuit 10 is VDD−Vtn, the voltage of the output signal V1out decreases as the Vtn increases, and the p-type MOS transistor 40 fails to establish a sufficiently OFF state and leaves an increased current to flow therethrough. Therefore, if the threshold voltage Vtn of the n-type MOS transistor 30 in the pass-transistor logic circuit 10 is increased in the non-operative mode, then the absolute value |Vtp| of the threshold voltage of the p-type MOS transistor in the CMOS inverter 50 must be larger accordingly.

However, there is a difficulty in increasing the absolute value |Vtp| of the threshold voltage of the p-type MOS transistor 40 in the CMOS inverter 50 because it requires a condition large different from the ordinary manufacturing process. Especially when the threshold voltage of the p-type MOS transistor is increased by independently applying the substrate voltage Vpsub to the substrate of the p-type MOS transistor like the third embodiment, a further higher voltage is required in the semiconductor integrated circuit device, and it is undesirable from the viewpoint of reliability.

Therefore, the sixth embodiment employs the feedback mechanism similar to the fourth embodiment. That is, in the operative mode, the stand-by signal SB is changed to HIGH to cut the feedback loop. Additionally, the ground potential GND is applied as the substrate potential control signal Vnsub to the n-type MOS transistor 30 in the pass-transistor logic circuit 10. As a result, the threshold voltage of the n-type MOS transistor 30 in the pass-transistor logic circuit 10 remains low, and the pass-transistor logic circuit 10 can operate at a high speed. Since the threshold voltage of the n-type MOS transistor 30 is low, the drop of the threshold value of the output signal V1out from the pass transistor logic circuit 10 is small. Therefore, the p-type MOS transistor 40 establishes an OFF state enough to prevent the flow of the leak current. For example, if the substrate potential control signal Vnsub of the n-type MOS transistor 30 is 0 V, then its threshold voltage Vtn (0V) is 0.6 V. therefore, if the absolute value |Vtp| of the threshold voltage of the p-type MOS transistor 40 is 1.0 V, for example, the p-type MOS transistor 40 establishes an OFF state enough to prevent a flow of the leak current. In the non-operative mode, the stand-by signal SB is changed to LOW to connect the feedback loop. Additionally, a negative voltage, −2 V, is applied as the substrate potential control signal Vnsub to the n-type MOS transistor 30 in the pass-transistor logic circuit 10. Therefore, the threshold voltage of the n-type MOS transistor 30 in the pass transistor logic circuit 10 becomes higher as compared with the case where the ground potential GND is applied as the substrate potential control signal Vnsub. Since the threshold voltage of the n-type, MOS transistor 30 is raised, the leak current flowing in the pass-transistor logic circuit 10 decreases. However, the drop of the threshold voltage becomes large when the output signal V1out from the pass-transistor logic circuit 10 is HIGH. Therefore, the high level is not sufficiently high to ensure an OFF state of the p-type MOS transistor 40 sufficient to prevent a flow of the leak current. For example, if the substrate potential control signal Vnsub is −2 V, then its threshold voltage Vtn (−2V) is 1.2 V. This is larger than 1.0 V as the absolute value |Vtp| of the threshold voltage of the p-type MOS transistor 40, explained above Therefore, the p-type MOS transistor 40 may fail to establish a sufficiently OFF state. However, since the output of the CMOS inverter 50 is LOW, the source voltage VDD connected to the source terminal S of the p-type MOS transistor 60 is supplied to the input of the CMOS inverter 50. As a result, also the p-type MOS transistor 40 becomes sufficiently OFF, and blocks the leak current. As explained above, according to the embodiment shown here, since the semiconductor integrated circuit device includes the feed back mechanism, it can prevent a leak current from flowing into the p-type MOS transistor 40 in the CMOS inverter 50 even when the threshold voltage is made higher by applying a negative voltage as the substrate potential control signal Vnsub to the n-type MOS transistor forming the pass-transistor logic circuit 10 in its non-operative mode.

At the same time, since the ground potential is used as the substrate potential control signal Vnsub of the n-type MOS transistor in the pass-transistor logic circuit 10 in its operative mode the threshold voltage of the n-type MOS transistor is lowered from the value in the non-operative mode to ensure high-speed operation of the pass-transistor logic circuit 10. Moreover, in the operative mode, also the feedback mechanism is inoperative, high-speed operation is ensured from this viewpoint.

Figure 8:
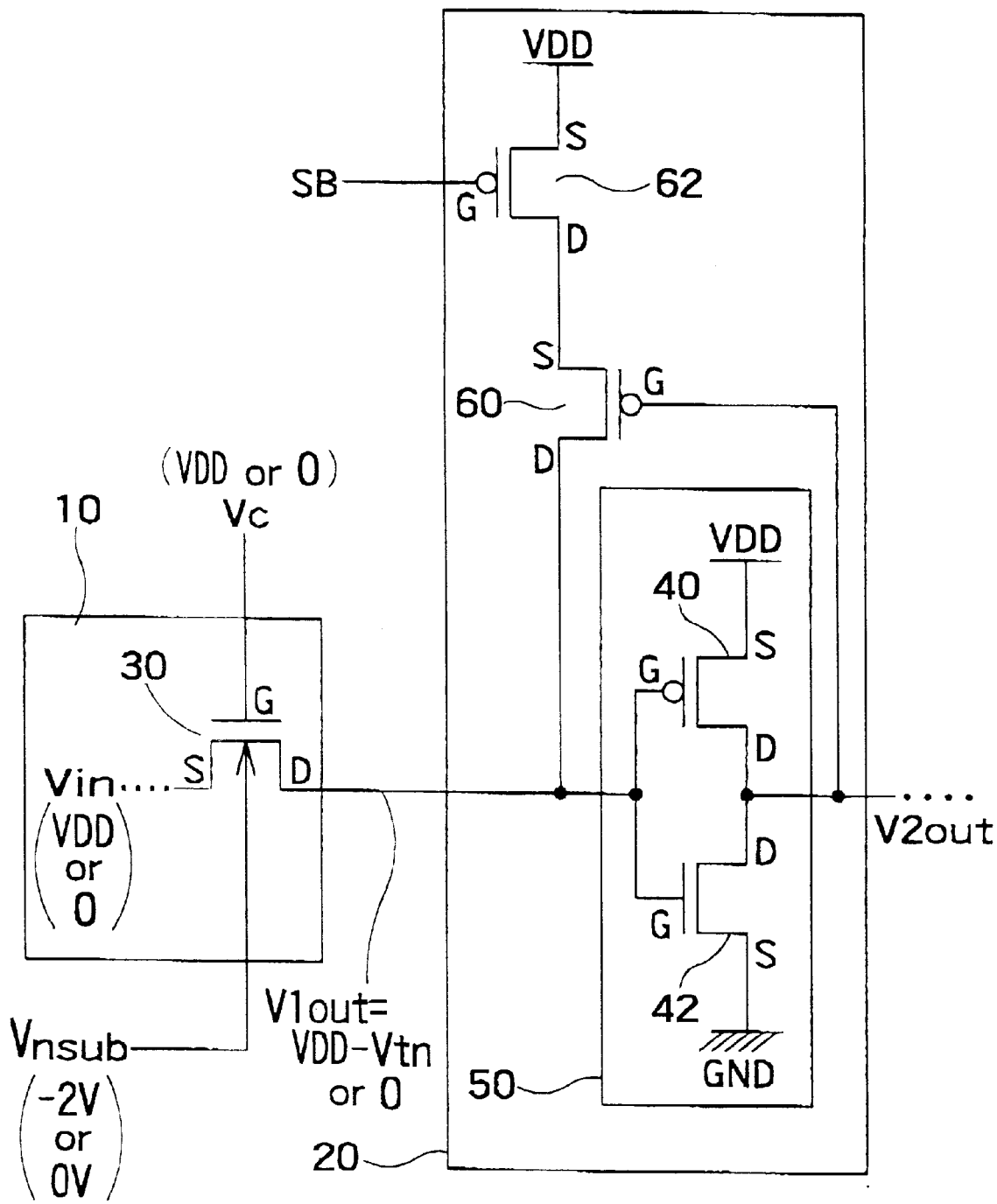
FIG. 8 is a view illustrating a modification of the semiconductor integrated circuit device according to the sixth embodiment of the invention.

In the sixth embodiment, positions of the p-type MOS transistors 60 and 62 may be replaced each other as shown in FIG. 8. The arrangement of FIG. 8, however, requires ON/OFF actions of the p-type MOS transistor 60 in the operative mode, and invites an increase in number of MOS transistors concerned. Therefore, it is inferior to the arrangement of FIG. 7 in operation speed.

(Seventh Embodiment)

The seventh embodiment is a version combining the third embodiment and the sixth embodiment to control the substrate potential of the n-type MOS transistor forming the pass-transistor logic circuit and to control the substrate voltage of the p-type MOS transistor of the CMOS inverter in the load circuit.

Figure 9:
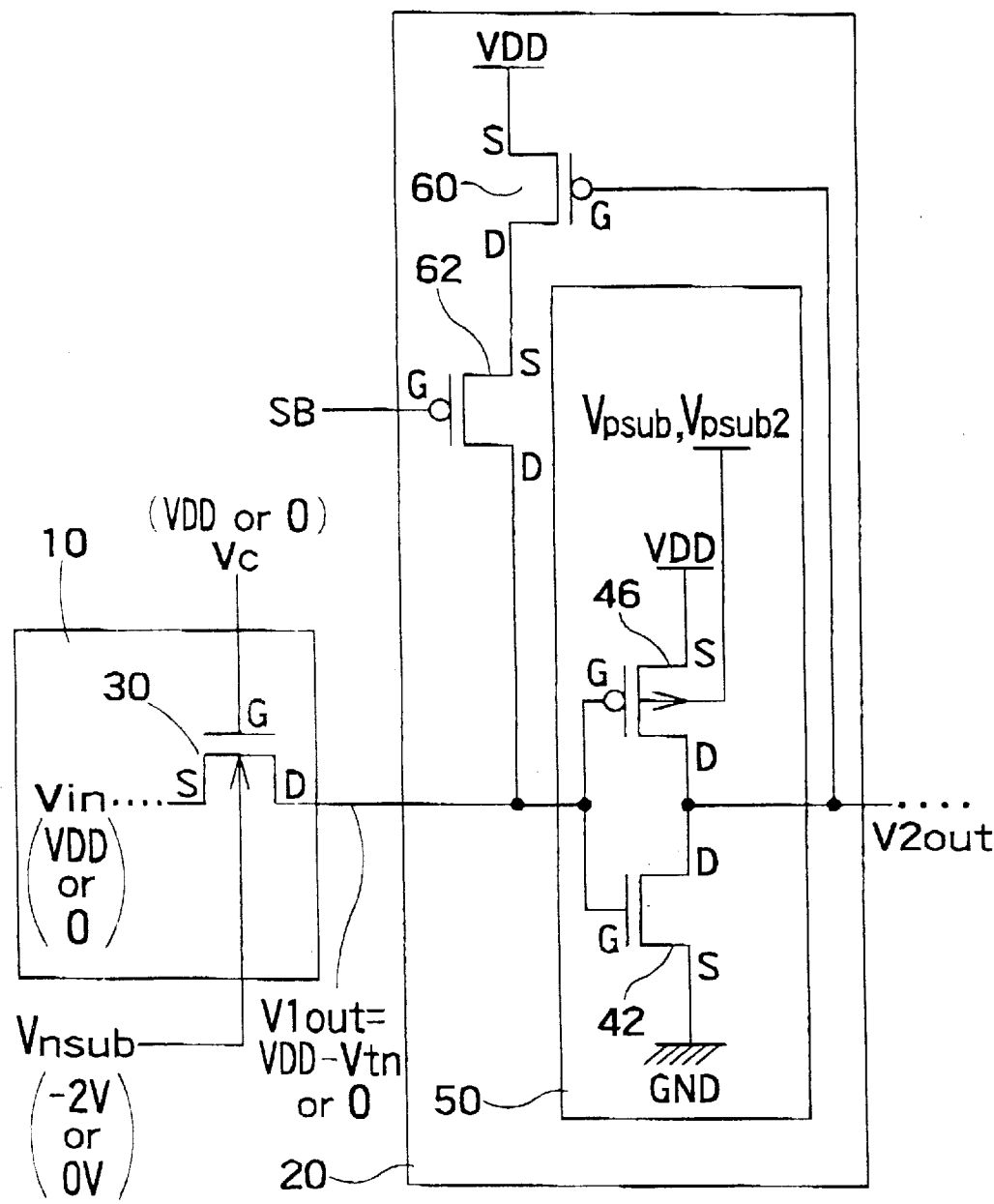
FIG. 9 is a view illustrating a semiconductor integrated circuit device according to the seventh embodiment of the invention.

FIG. 9 illustrates the semiconductor integrated circuit device according to the seventh embodiment. As shown in FIG. 9, the n-type MOS transistor forming the pass-transistor logic circuit 10 is independently supplied with the substrate potential control signal Vnsub. Similarly to the foregoing sixth embodiment, the substrate potential control signal Vnsub is applied to lower the threshold voltage of the n-type MOS transistor forming the pass-transistor logic circuit 10 in the operative mode and raise it in the non-operative mode.

The p-type MOS transistor 46 of the CMOS inverter 50 in the load circuit 20 is supplied with a substrate voltage Vpsub or substrate voltage Vpsub2 separately from the source voltage VDD. That is, the p-type MOS transistor 46 is so configured that two kinds of substrate voltages Vpsub, Vpsub2 can be applied thereto. One of these substrate voltages, Vpsub, is higher than the source voltage VDD, and it is applied to enlarge the threshold voltage |Vtp| of the p-type MOS transistor 46. The other substrate voltage Vpsub2 is higher than the substrate voltage Vpsub, and it is applied to enlarge the threshold voltage |Vtp| of the p-type MOS transistor 46 more. In the embodiment shown here, if the source voltage VDD is 5 V, then the substrate voltage Vpsub is 7V, and the substrate voltage Vpsub2 is 9 V. Under the condition where the source voltage VDD is applied to the p-type MOS transistor 46, the threshold voltage |Vtp| of the p-type MOS transistor 46 and the threshold voltage Vtn of the n-type MOS transistor 30 are approximately equal. That is, similarly to the third embodiment, the basic structure of the p-type MOS transistor 46 is the same as those of the other MOS transistors.

Essentially, the semiconductor integrated circuit device according to the seventh embodiment behaves in the same manner as the semiconductor integrated circuit device according to the foregoing sixth embodiment. However, whichever one of the substrate voltages Vpsub and Vpsub2 be applied is responsive to the stand-by signal SB, similarly to the substrate potential control signal Vnsub.

That is, in the operative mode, the lower substrate voltage, Vpsub, is applied to the p-type MOS transistor 46. As explained with the sixth embodiment, when the output signal V1out of the pass-transistor logic circuit 10 is HIGH, its voltage is VDD−Vtn. However, since it is in the operative mode, the threshold voltage of the n-type MOS transistor 30 forming the pass-transistor logic circuit 10 is low. Therefore, the drop by the threshold voltage is not so large, and the p-type MOS transistor 46 exhibits a sufficiently OFF state, and no leak current flows into the CMOS inverter 50. For example, if 0 V is applied as the substrate potential control signal Vnsub to the n-type MOS transistor 30, then its threshold voltage Vtn (0 V) becomes 0.6 V. At that time, the substrate voltage of the p-type MOS transistor 46 is Vpsub of 7 V, and the absolute value of the threshold voltage, |Vtp(7V)| is 1.2 V. Accordingly, the p-type MOS transistor 46 establishes a sufficiently OFF state.

In the non-operative mode, the higher substrate voltage Vpsub2 is applied to the p-type MOS transistor 46. As explained with the sixth embodiment, when the output signal V1out of the pass-transistor logic circuit 10 is HIGH, its voltage is VDD−Vtn. However, since it is in the non-operative mode, the threshold voltage of the n-type 140S transistor 30 forming the pass-transistor logic circuit 10 is high, and the drop of the threshold voltage is large. Therefore, also the threshold voltage |Vtp| of the p-type MOS transistor 46 must be enlarged accordingly. In order to enlarge the threshold voltage |Vtp|, the substrate voltage Vpsub2 higher than the substrate voltage Vpsub is applied to the p-type MOS transistor 46. As a result, the threshold voltage |Vtp| of the p-type MOS transistor 46 becomes larger, and makes a sufficiently OFF state. For example, if −2 V is applied as the substrate potential control signal Vnsub to the n-type MOS transistor 30, its threshold voltage Vtn (−2 V) becomes 1.2 V. At that time, the substrate potential of the p-type MOS transistor 46 is Vpsub2 of 9 V, and the absolute value of the threshold voltage, |Vtp(9V)| is 1.8 V. As a result, the p-type MOS transistor 46 establishes a sufficiently OFF state.

It is also possible to change the basic structure of the p-type MOS transistor 48, such as impurity concentration, etc. of its diffusion layer or channel layer to use only one substrate potential Vpsub. That is, like the first embodiment, the structure for making the threshold voltage |Vtp| of the p-MOS transistor 48 larger than the threshold voltage Vtn of the n-type MOS transistor 30 can be built in originally.

That is, the device is configured to ensure a sufficient OFF state of the p-type MOS transistor 48 with the output signal V1out of the voltage VDD−Vtn even when the substrate voltage Vpsub of the p-type MOS transistor 48 is the same potential as the source voltage VDD. Then, in the non-operative mode, by applying the substrate voltage Vpsub (for example, 7 V) higher than the source voltage VDD (for example, 5 V) to the p-type MOS transistor 48, the threshold voltage |Vtp| of the p-type MOS transistor 48 is raised further so that the p-type MOS transistor 48 can be turned sufficiently OFF even when the drop by the threshold voltage of the n-type MOS transistor is large. In this manner, the number of different power sources can be reduced.

Figure 10:
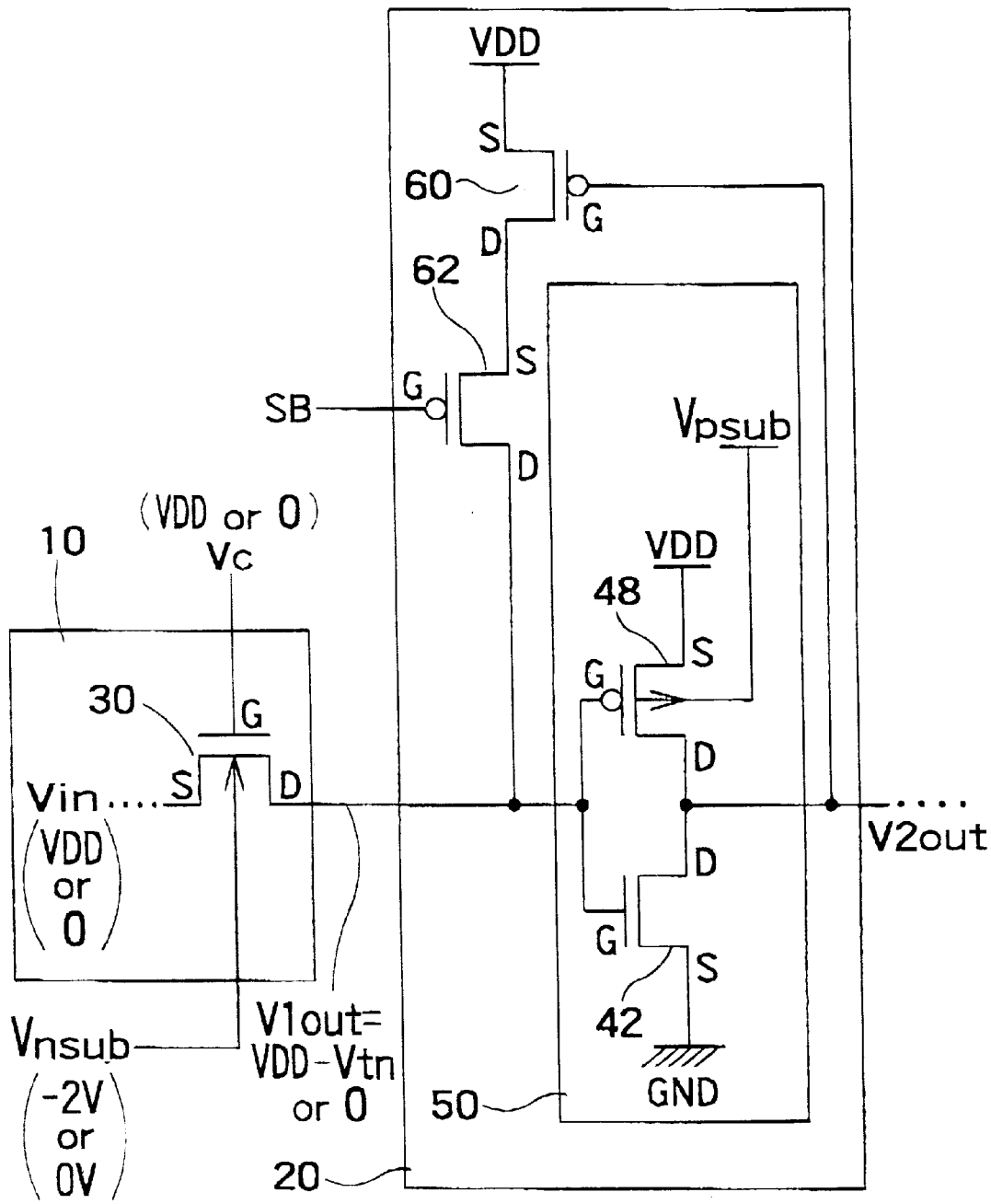
FIG. 10 is a view illustrating a modification of the semiconductor integrated circuit device according to the seventh embodiment of the invention.

The invention is not limited to the above-explained embodiments, but involves various modifications. For example, As shown in FIGS. 9 and 10 illustrating the seventh embodiment, positions of the p-type MOS transistors 60, 62 can be replaced with each other similarly to the fourth embodiment. Additionally, not only in the first embodiment, but also in the second to seventh embodiments, the threshold voltage |Vtp| must be larger than the threshold voltage Vtn by at lest 0.3, more preferably by at least 5 V, to more effectively block the leak current. Further, the load circuit 20 may become any CMOS logic circuit other than the inverter.

According to the invention, since the device is so configured that the absolute value |Vtp| of the threshold voltage of the p-type MOS transistor for CMOS in the CMOS inverter forming the load circuit be larger than the threshold voltage Vtn of the n-type MOS transistor for the logic circuit forming the pass-transistor logic circuit, a leak current is prevented from flowing into the CMOS inverter even when the output of the pass-transistor logic circuit is HIGH.

What is claimed is:

1. A semiconductor integrated circuit device comprising:
   a pass-transistor logic circuit having at least one n-type MOS transistor forming a logic circuit to supply a logic output signal; and
   a load circuit having a CMOS inverter including a p-type MOS transistor forming the CMOS inverter and an n-type MOS transistor forming the CMOS inverter which are connected in series between a first power source and a second power source, said p-type MOS transistor forming the COMS inverter and said n-type MOS transistor forming the CMOS inverter having gate terminals supplied with said logic output signal forming the input of said CMOS inverter, said p-type MOS transistor forming the CMOS inverter and said n-type MOS transistor having a common connected point from which a load output signal is output and which forms the output of said CMOS inverter, the threshold voltage value Vtn of said n-type MOS transistor forming the CMOS inverter being substantially equal to the threshold voltage value Vtn of said n-type MOS transistor forming the logic circuit, and said p-type MOS transistor forming the CMOS inverter having the threshold voltage value whose absolute value |Vtp| is larger than the threshold voltages Vtn of the n-type MOS transistor forming the logic circuit and the n-type MOS transistor forming the CMOS inverter; and
   wherein said load circuit further comprises a feedback mechanism including a p-type MOS transistor for feedback purposes having a source terminal connected to said first power source, a gate terminal connected to the output of the CMOS inverter and a drain terminal connected to the input of the CMOS inverter;
   wherein said feedback mechanism does not function when said pass-transistor logic circuit is in its operative mode, but supplies said first power source to the input of the CMOS inverter when said pass-transistor logic circuit is in its non-operative mode and the logic output signal is high level.

2. The semiconductor integrated circuit device according to claim 1 wherein the absolute value |Vtp| of the threshold voltage of the p-type MOS transistor forming the CMOS inverter is larger than the threshold voltage Vtn of the n-type MOS transistor forming the logic circuit by not less than 0.3 V.

3. The semiconductor integrated circuit device according to claim 1 wherein the absolute value |Vtp| of the threshold voltage of the p-type MOS transistor forming the CMOS inverter is larger than the threshold voltage Vtn of the n-type MOS transistor forming the logic circuit by not less than 0.5 V.

4. The semiconductor integrated circuit device according to claim 1 wherein the threshold voltage of said p-type MOS transistor forming the CMOS inverter is controlled by a substrate potential.

5. The semiconductor integrated circuit device according to claim 1 wherein said feedback mechanism further comprises a p-type MOS transistor for cutting connection connected between the drain terminal of said p-type MOS transistor for feedback purposes and the input of said CMOS inverter, said p-type MOS transistor for cutting connection having a gate terminal supplied with a stand-by signal which becomes a high level in said operative mode to turn off said p-type MOS transistor for cutting connection and becomes a low level in said non-operative mode to turn on said p-type MOS transistor for cutting connection.

6. The semiconductor integrated circuit device according to claim 1 wherein said feedback mechanism further comprises a p-type MOS transistor for cutting connection connected between said first power source and the source terminal of said p-type MOS transistor for feedback purposes, said p-type MOS transistor for cutting connection having a gate terminal supplied with a stand-by signal which becomes a high level in said operative mode to turn off said p-type MOS transistor for cutting connection and becomes a low level in said non-operative mode to turn on said p-type MOS transistor for cutting connection.

7. The semiconductor integrated circuit device according to claim 1 further comprising means for applying a substrate potential control signal to said n-type MOS transistor forming the logic circuit in said pass-transistor logic circuit, the threshold voltage Vtn of said n-type MOS transistor forming the logic circuit being higher when said pass-transistor logic circuit is in the operative mode than in the non-operative mode.

8. A semiconductor integrated circuit device comprising:
a pass-transistor logic circuit having at least one n-type MOS transistor forming a logic circuit to supply a logic output signal;
a load circuit having a CMOS inverter including a p-type MOS transistor forming the CMOS inverter and an n-type MOS transistor forming the CMOS inverter which are connected in series between a first power source and a second power source, said p-type MOS transistor forming the COMS inverter and said n-type MOS transistor forming the CMOS inverter having gate terminals supplied with said logic output signal forming the input of said CMOS inverter, said p-type MOS transistor forming the CMOS inverter and said n-type MOS transistor having a common connected point from which a load output signal is output and which forms the output of said CMOS inverter, the threshold voltage value Vtn of said n-type MOS transistor forming the CMOS inverter being substantially equal to the threshold voltage value Vtn of said n-type MOS transistor forming the logic circuit, and said p-type MOS transistor forming the CMOS inverter having the threshold voltage value whose absolute value |Vtp| is larger than the threshold voltages Vtn of the n-type MOS transistor forming the logic circuit and the n-type MOS transistor forming the CMOS inverter;
an additional CMOS inverter having a p-type MOS transistor forming the additional CMOS inverter and an n-type MOS transistor forming the additional CMOS inverter which are connected in series between a third power source and a fourth power source, said p-type MOS transistor forming the additional CMOS inverter and said n-type MOS transistor forming the additional CMOS inverter having gate terminals which are supplied with said load output signal and form the input of said additional CMOS inverter, and said p-type MOS transistor forming the additional CMOS inverter and said n-type MOS transistor forming the additional CMOS inverter having a common connected point from which an inverted load output signal is output and which forms the output of said additional CMOS inverter; and
a feedback mechanism for feeding said inverted load output signal back to the input of said CMOS inverter;
wherein said feedback mechanism does not function when said pass-transistor logic circuit is in the operative mode, but functions when said pass-transistor logic circuit is in the non-operative mode to supply said inverted load output signal to the input of said CMOS inverter.

9. The semiconductor integrated circuit device according to claim 8 wherein said feedback mechanism further comprises:
a p-type MOS transistor for cutting connection connected between the output of said additional CMOS inverter and the input of said CMOS inverter, said p-type MOS transistor for cutting connection having a gate terminal supplied with a stand-by signal which becomes a high level in said operative mode to turn off said p-type MOS transistor for cutting connection and becomes a low level in said non-operative mode to turn on said p-type MOS transistor for cutting connection.

10. A semiconductor integrated circuit device comprising:
a pass-transistor logic circuit having at least one n-type MOS transistor forming a logic circuit to supply a logic output signal; and
a load circuit including a CMOS inverter having a p-type MOS transistor forming the CMOS inverter and an n-type MOS transistor forming the CMOS inverter which are connected in series between a first power source and a second power source, said p-type MOS transistor forming the CMOS inverter and said n-type MOS transistor forming the CMOS inverter having gate terminals supplied with said logic output signal forming the input of said CMOS inverter, said p-type MOS transistor forming the CMOS inverter and said n-type MOS transistor forming the CMOS inverter having a common connected point from which a load output signal is output and which forms the output of said CMOS inverter, and said p-type MOS transistor forming the CMOS inverter having a threshold voltage value whose absolute value |Vtp| is larger than the threshold voltage Vtn of the n-type MOS transistor forming the logic circuit, said load circuit further including a feedback mechanism which does not function when said pass-transistor logic circuit is in the operative mode, but functions when said pass-transistor logic circuit is in the non-operative mode to supply said first power source to the input of said CMOS inverter.

11. The semiconductor integrated circuit device according to claim 10 wherein said feedback mechanism further includes:
a p-type MOS transistor for feedback purposes having a source terminal connected to said first power source and a gate terminal connected to the output of said CMOS inverter; and
a p-type MOS transistor for cutting connection having a source terminal connected to the drain terminal of said p-type MOS transistor for feedback purposes, a drain terminal connected to the input of said CMOS inverter, and a gate terminal supplied with a stand-by signal which becomes a high level in said operative mode to turn off said p-type MOS transistor for cutting connection and becomes a low level in said non-operative mode to turn on said p-type MOS transistor for cutting connection.

12. The semiconductor integrated circuit device according to claim 10 wherein said feedback mechanism further includes:
   a p-type MOS transistor for cutting connection having a source terminal connected to said first power source and a gate terminal supplied with a stand-by signal which becomes a high level in said operative mode to turn off said p-type MOS transistor for cutting connection and becomes a low level in said non-operative mode to turn on said p-type MOS transistor for cutting connection; and
   a p-type MOS transistor for feedback purposes having a source terminal connected to the drain terminal of said MOS transistor for cutting connection, a gate terminal connected to the output of said CMOS inverter and a drain terminal connected to the input of said CMOS inverter.

13. The semiconductor integrated circuit device according to claim 10 wherein the threshold voltage value Vtn of said n-type MOS transistor forming the CMOS inverter is substantially equal to the threshold voltage value Vtn of said n-type MOS transistor forming the logic circuit.

14. A semiconductor integrated circuit device comprising:
   a pass-transistor logic circuit including at least one n-type MOS transistor forming the logic circuit to supply a logic output signal, said n-type MOS transistor forming the logic circuit being selectively applied with a substrate potential control signal to raise the threshold voltage of said n-type MOS transistor forming the logic circuit when said pass-transistor logic circuit is in a non-operative mode than that in an operative mode; and
   a load circuit including a CMOS inverter having a p-type MOS transistor forming the CMOS inverter and an n-type MOS transistor forming the CMOS inverter which are connected in series between a first power source and a second power source, said p-type MOS transistor forming the CMOS inverter and said n-type MOS transistor forming the CMOS inverter having gate terminals supplied with said logic output signal forming the input of said CMOS inverter, said p-type MOS transistor forming the CMOS inverter and said n-type MOS transistor forming the CMOS inverter having a common connected point from which a load output signal is output and which forms the output of said CMOS inverter, and said p-type MOS transistor forming the CMOS inverter having a threshold voltage value whose absolute value |Vtp| is larger than the threshold voltage of the n-type MOS transistor forming the logic circuit in the operative mode, said load circuit further including a feedback mechanism which does not function when said pass-transistor logic circuit is in the operative mode, but functions when said pass-transistor logic circuit is in the non-operative mode to supply said first power source to the input of said CMOS inverter when the logic output signal is high level.

15. The semiconductor integrated circuit device according to claim 14 wherein said feedback mechanism includes;
   a p-type MOS transistor for feedback purposes having a source terminal connected to said first power source and a gate terminal connected to the output of said CMOS inverter; and
   a p-type MOS transistor for cutting connection having a source terminal connected to the drain terminal of said p-type MOS transistor for feedback purposes, a drain terminal connected to the input of said CMOS inverter, and a gate terminal supplied with a stand-by signal which becomes a high level in said operative mode to turn off said p-type MOS transistor for cutting connection and becomes a low level in said non-operative mode to turn on said p-type MOS transistor for cutting connection.

16. The semiconductor integrated circuit device according to claim 15 wherein means is provided to selectively apply a first substrate voltage higher than the voltage of said first power source and a second substrate voltage higher than said first substrate voltage to said p-type MOS transistor forming the CMOS inverter, so that said first substrate voltage is applied in said operative mode and said second substrate voltage in said non-operative mode to said p-type MOS transistor forming the CMOS inverter, and
   the absolute value |Vtp| of the threshold voltage value of said p-type MOS transistor forming the CMOS inverter is operationally equivalent to the threshold voltage of said n-type MOS transistor forming the logic circuit, and the absolute value |Vtp| becomes larger than the threshold voltages of the n-type MOS transistor forming the logic circuit and the n-type MOS transistor forming the CMOS inverter by means of applied the first substrate voltage or the second substrate voltage to said p-type MOS transistor forming the CMOS inverter.

17. The semiconductor integrated circuit device according to claim 15 wherein said p-type MOS transistor forming the CMOS inverter has a basic structure with a threshold voltage whose absolute value |Vtp| is larger than the threshold voltage Vtn of said n-type MOS transistor forming the logic circuit, and means is provided to selectively apply a third substrate voltage higher than the voltage of said first power source, said third substrate voltage being not applied to said p-type MOS transistor forming the CMOS inverter in said operative mode and being applied to said p-type MOS transistor forming the CMOS inverter in said non-operative mode.

18. The semiconductor integrated circuit device according to claim 14 wherein said feedback mechanism includes:
   a p-type MOS transistor for cutting connection having a source terminal connected to said first power source and a gate terminal supplied with a stand-by signal which becomes a high level in said operative mode to turn off said p-type MOS transistor for cutting connection and becomes a low level to tun on said p-type MOS transistor for cutting connection; and
   a p-type MOS transistor for feedback purposes having a source terminal connected to the drain terminal of said p-type MOS transistor for cutting connection, a gate terminal connected to the output of said CMOS inverter, and a drain terminal connected to the input of said CMOS inverter.

19. The semiconductor integrated circuit device according to claim 14 wherein the absolute value |Vtp| of the threshold voltage of the p-type MOS transistor forming the CMOS inverter is larger than the threshold voltage of the n-type MOS transistor forming the CMOS inverter.

* * * * *